US012088265B2

(12) United States Patent
Yasuda

(10) Patent No.: US 12,088,265 B2
(45) Date of Patent: Sep. 10, 2024

(54) SEMICONDUCTOR DEVICE

(71) Applicant: Kioxia Corporation, Tokyo (JP)

(72) Inventor: Yohei Yasuda, Yokohama Kanagawa (JP)

(73) Assignee: KIOXIA CORPORATION, Tokyo (JP)

(*) Notice: Subject to any disclaimer, the term of this patent is extended or adjusted under 35 U.S.C. 154(b) by 437 days.

(21) Appl. No.: 17/369,399

(22) Filed: Jul. 7, 2021

(65) Prior Publication Data
US 2022/0200552 A1 Jun. 23, 2022

(30) Foreign Application Priority Data
Dec. 17, 2020 (JP) ................ 2020-209081

(51) Int. Cl.
H03F 3/45 (2006.01)
(52) U.S. Cl.
CPC ........... H03F 3/45179 (2013.01); H03F 2203/45024 (2013.01)
(58) Field of Classification Search
CPC ....... H03F 3/45179; H03F 2203/45024; H03F 2203/30105; H03F 2203/30138; H03F 3/303; H03F 3/45183; G11C 7/1057; G11C 16/28
USPC ....................................................... 330/253
See application file for complete search history.

(56) References Cited

U.S. PATENT DOCUMENTS 7,271,659 B2 9/2007 Deas et al.
8,405,428 B2* 3/2013 Fukuda ............... H03K 17/04
327/87
8,536,944 B2 9/2013 Spaeth
8,861,659 B2 10/2014 Hasegawa et al.
9,634,629 B2* 4/2017 Watanabe ........... H03F 3/4521
(Continued)

FOREIGN PATENT DOCUMENTS

JP 2012-004620 A 1/2012
JP 5971366 B1 8/2016
(Continued)

OTHER PUBLICATIONS

Bae, Seung-Jun et al., "A 40nm 2Gb 7Gb/s/pin GDDR5 SDRAM with a Programmable DQ ordering crosstalk Equalizer and Adjustable Clock-Tracking BW," 2011 IEEE International Solid-State Circuits Conference, Feb. 2011, pp. 3 total.
(Continued)

Primary Examiner — Andrea Lindgren Baltzell
Assistant Examiner — Khiem D Nguyen
(74) Attorney, Agent, or Firm — Foley & Lardner LLP

(57) ABSTRACT

A semiconductor device having a first differential amplification circuit is disclosed. The first differential amplification circuit includes a first input transistor having a gate configured to receive a first signal, a second input transistor having a gate configured to receive a second signal, a first current source connected to a source of the first input transistor and a source of the second input transistor, a first transistor that is connected in parallel to the source of the first input transistor and the source of the second input transistor and has a gate configured to receive the first signal, and a second transistor that is connected in series to the first transistor and has a gate configured to receive a control signal.

16 Claims, 23 Drawing Sheets

(56) References Cited

U.S. PATENT DOCUMENTS

2005/0088238 A1    4/2005   Deas et al.
2011/0304377 A1    12/2011  Fukuda et al.
2016/0036397 A1*   2/2016   Watanabe ............. H03F 3/4521
                                                      330/295
2020/0266783 A1    8/2020   Yasuda

FOREIGN PATENT DOCUMENTS

JP      5993174 B2      9/2016
JP      2020-136902 A   8/2020

OTHER PUBLICATIONS

Bae, Seung-Jun et al., "A 40nm 7Gb/s/pin Single-ended Transceiver with Jitter and ISI Reduction Techniques for High-Speed DRAM Interface," 2010 Symposium on VLSI Circuits/Technical Digest of Technical Papers, Jul. 2010, pp. 193-194.
Hwang Kyu-Dong et al., "A 16Gb/s/pin 8Gb GDDR6 DRAM with Bandwidth Extension Techniques for High-Speed Applications," 2018 IEEE International Solid-State Circuits Conference, Feb. 2018, pp. 3 total.

\* cited by examiner

SEMICONDUCTOR DEVICE

CROSS-REFERENCE TO RELATED APPLICATIONS

This application is based upon and claims the benefit of priority from Japanese Patent Application No. 2020-209081, filed Dec. 17, 2020, the entire contents of which are incorporated herein by reference.

FIELD

Embodiments described herein relate generally to a semiconductor device.

BACKGROUND

In a semiconductor device including a differential amplification circuit that receives an input signal and a reference signal with a pair of transistors configured as a differential pair, a power supply voltage is used to amplify a difference between the input signal and the reference signal to generate an output signal. It is generally desirable to speed up an operation of the differential amplification circuit.

DETAILED DESCRIPTION

Embodiments provide a semiconductor device capable of speeding up an operation of a differential amplification circuit.

According to one embodiment, there is provided a semiconductor device having a first differential amplification circuit. The first differential amplification circuit has a first input transistor having a gate configured to receive a first signal, a second input transistor having a gate configured to receive a second signal, a first current source connected to a source of the first input transistor and a source of the second input transistor, a first transistor that is connected in parallel to the source of the first input transistor and the source of the second input transistor and has a gate configured to receive the first signal, and a second transistor that is connected in series to the first transistor and has a gate configured to receive a control signal.

A semiconductor device to embodiments will be described in detail with reference to the accompanying drawings. The present disclosure is not limited to these embodiments.

First Embodiment

A semiconductor device to a first embodiment includes a differential amplification circuit. The differential amplification circuit receives an input signal and a reference signal by using a pair of transistors configured as the differential pair. The differential amplification circuit uses a power supply voltage to amplify a difference between the input signal and the reference signal and thus to generate an output signal. A semiconductor device including a differential amplification circuit may be used as a receiver in a high-speed interface of a semiconductor memory. In this case, it is desirable to speed up an operation of the differential amplification circuit.

However, with the present circuit configuration, in order to increase the speed, a current is typically required to significantly increase to improve a drive force of each transistor. Thus, power consumption may increase due to an increase in heat generated by a parasitic resistance component of a wiring.

Therefore, in the present embodiment, a pre-emphasis circuit that forms a signal waveform into an undershoot waveform and an overshoot waveform is added to the differential amplification circuit of the semiconductor device. As such, reduction of power consumption and increase of speed for the differential amplification circuit can both be achieved.

Figure 1:
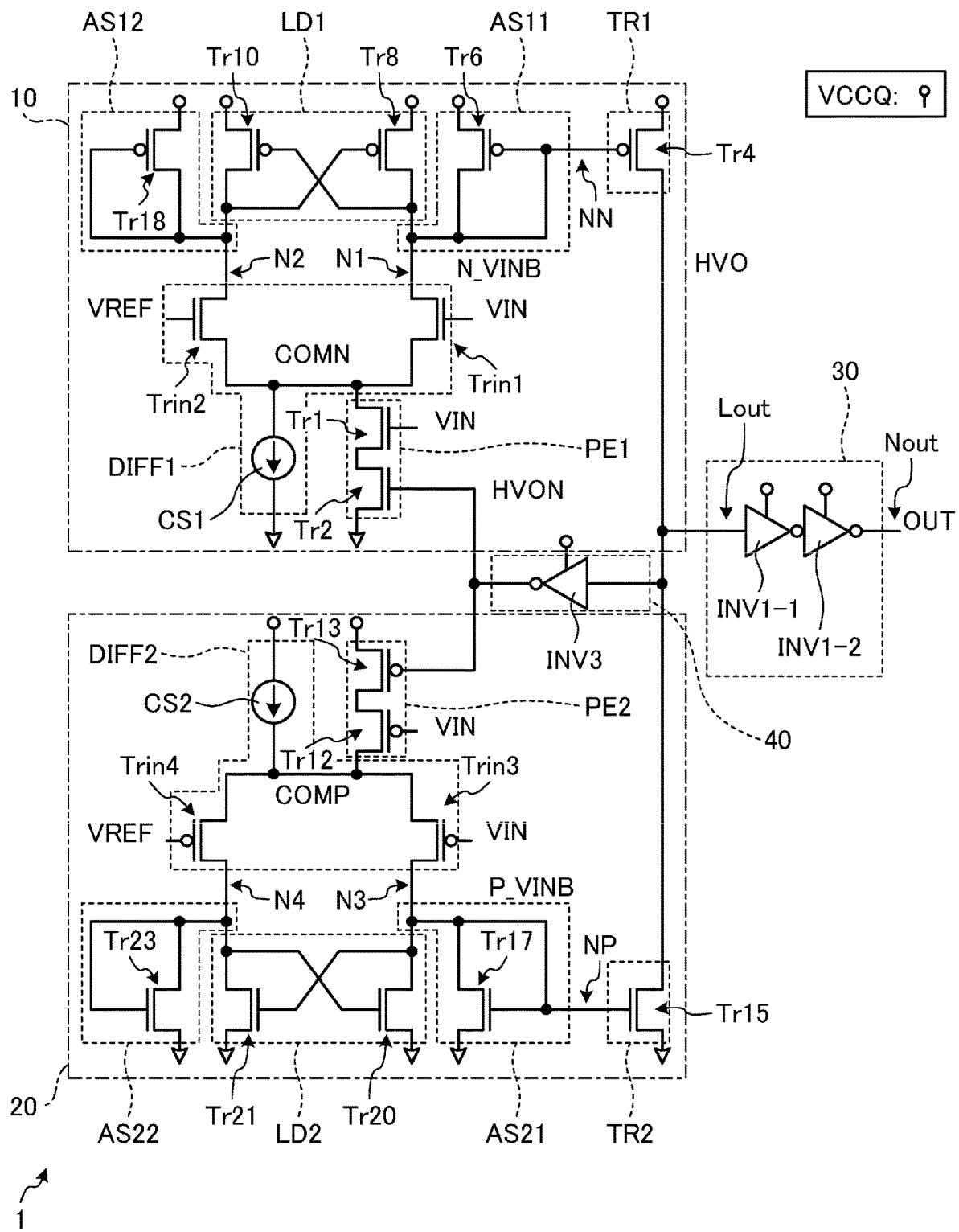
FIG. 1 is a circuit diagram showing a configuration of a semiconductor device according to a first embodiment.

Specifically, a semiconductor device 1 may be configured as shown in FIG. 1. FIG. 1 is a circuit diagram showing a configuration of the semiconductor device 1.

The semiconductor device 1 implements a single input/ single output circuit by using two differential amplification circuits in which polarities of elements provided therein are inverted from each other. The semiconductor device 1 receives an input signal VIN as a single input, converts the input signal VIN into a differential signal, performs an amplification process thereon, generates an output signal OUT from the processed differential signal, and outputs the output signal OUT as a single output.

The semiconductor device 1 includes a differential amplification circuit 10, a differential amplification circuit 20, an output circuit 30, and a control circuit 40. The differential amplification circuit 10 and the differential amplification circuit 20 are arranged in parallel to each other on the input side of the output circuit 30. The differential amplification circuit 10 is a differential amplification circuit that receives an input signal VIN with an N-type transistor (differential amplification circuit related to N-type transistor reception). The differential amplification circuit 20 is a differential amplification circuit that receives an input signal VIN with a P-type transistor (differential amplification circuit related to P-type transistor reception). The control circuit 40 is disposed between the differential amplification circuit 10 and the differential amplification circuit 20, and the output circuit 30. The differential amplification circuit 10 has a pre-emphasis circuit PE1, and the differential amplification circuit 20 has a pre-emphasis circuit PE2.

The differential amplification circuit 10 receives the input signal VIN and a reference signal VREF with a pair of input transistors Trin1 and Trin2 configuring a differential pair, respectively, and amplifies a difference between the input signal VIN and the reference signal VREF by using a power supply voltage VCCQ, and generates a signal HVO in cooperation with the differential amplification circuit 20. Each of the input transistors Trin 1 and Trin 2 is an N-type transistors. The reference signal VREF may be preset according to a level of the power supply voltage VCCQ. The reference signal VREF may have, for example, approximately half the level of the power supply voltage VCCQ. In this case, the pre-emphasis circuit PE1 forms a waveform of an internal signal of the differential amplification circuit 10 into an undershoot waveform. Consequently, a slope of the signal HVO at the time of level transition can be steepened.

The differential amplification circuit 20 receives the input signal IN and the reference signal VREF with a pair of input transistors Trin3 and Trin4 configuring a differential pair, respectively, amplifies a difference between the input signal VIN and the reference signal VREF by using the power supply voltage VCCQ, and generates the signal HVO in cooperation with the differential amplification circuit 10. Each of the input transistors Trin3 and Trin4 is a P-type transistor. In this case, the pre-emphasis circuit PE2 forms a waveform of an internal signal of the differential amplification circuit 20 into an overshoot waveform. Consequently, a slope of the signal HVO at the time of level transition can be steepened.

The output circuit 30 receives the signal HVO from the differential amplification circuit 10 and the differential amplification circuit 20. In this case, the pre-emphasis circuit PE1 and the pre-emphasis circuit PE2 can steepen a slope of the signal HVO at the time of level transition.

The output circuit 30 generates and outputs an output signal OUT corresponding to the signal HVO. In this case, since the slope of the signal HVO at the level transition can be steepened, a slope of the output signal OUT at the level transition can also be steepened. The output circuit 30 may generate the output signal OUT by logically inverting the signal HVO an even number of times (twice in FIG. 1) and output the output signal OUT. The output signal OUT may have the same logic level as that of the signal HVO.

The control circuit 40 receives the signal HVO from the differential amplification circuit 10 and the differential amplification circuit 20. The control circuit 40 uses the power supply voltage VCCQ to generate a signal HVON corresponding to the signal HVO and feeds the signal HVON back to the pre-emphasis circuit PE1 of the differential amplification circuit 10 and the pre-emphasis circuit PE2 of the differential amplification circuit 20. The control circuit 40 may generate the signal HVON by logically inverting the signal HVO an odd number of times (once in FIG. 1) and output the signal HVON. The signal HVON is a control signal for controlling the pre-emphasis circuits PE1 and PE2.

The differential amplification circuit 10 includes a differential circuit DIFF1, a pre-emphasis circuit PE1, a load circuit LD1, an auxiliary circuit AS11, an auxiliary circuit AS12, and a transmission circuit TR1. The differential circuit DIFF1 is disposed between the load circuit LD1 and the ground voltage. The pre-emphasis circuit PE1 is disposed between the differential circuit DIFF1 and the ground voltage. The load circuit LD1 is disposed between the differential circuit DIFF1 and the power supply voltage VCCQ. The load circuit LD1 is configured with a circuit (cross-coupled circuit) in which gates and drains of two transistors are cross-coupled.

The transmission circuit TR1 has a transistor Tr4 as a fourth transistor. The transistor Tr4 may be configured with a PMOS transistor. A gate of the transistor Tr4 is connected to the auxiliary circuit AS11 via a bias line NN. A drain of the transistor Tr4 is connected to the output circuit 30, and a source thereof is connected to the power supply voltage VCCQ.

The differential circuit DIFF1 has an input transistor Trin1 as a first input transistor, an input transistor Trin2 as a second input transistor, and a current source CS1. The input transistor Trin1 and the input transistor Trin2 configure a differential pair. Each of the input transistor Trin1 and the input transistor Trin2 may be configured with an NMOS transistor. The input transistor Trin1 has a gate receiving the input signal VIN, a drain electrically connected to a node N1, and a source electrically connected to one end of the current source CS1. The input transistor Trin2 has a gate receiving the reference signal VREF, a drain electrically connected to a node N2, and a source electrically connected to one end of the current source CS1. The other end of the current source CS1 is electrically connected to the ground voltage.

The pre-emphasis circuit PE1 has a transistor Tr1 as a first transistor and a transistor Tr2 as a second transistor. The transistor Tr1 is connected in parallel to the source of the input transistor Trin1 and the source of the input transistor Trin2 along with the current source CS1. The transistor Tr2 is connected in series to the transistor Tr1. Each of the transistor Tr1 and the transistor Tr2 may be configured with an NMOS transistor. The transistor Tr1 has a gate receiving the input signal VIN, a drain electrically connected to the source of the input transistor Trin1 and the source of the input transistor Trin2, and a source electrically connected to the transistor Tr2. The transistor Tr2 has a gate receiving the signal HVON, a source electrically connected to the ground voltage, and a drain electrically connected to the transistor Tr1.

The load circuit LD1 has a transistor Tr8 as an eighth transistor and a transistor Tr10 as a tenth transistor. Gates and drains of the transistor Tr8 and the transistor Tr10 are cross-coupled. Each of the transistor Tr8 and the transistor Tr10 may be configured with a PMOS transistor. The transistor Tr8 has the gate connected to the gate and the drain of the transistor Tr10, the drain electrically connected to the node N1, and the source electrically connected to the power supply voltage VCCQ. The transistor Tr10 has the gate connected to the drain and the gate of the transistor Tr8, the drain electrically connected to the node N2, and the source electrically connected to the power supply voltage VCCQ.

The auxiliary circuit AS11 has a transistor Tr6 as a sixth transistor. The transistor Tr6 may be configured with a PMOS transistor. The transistor Tr6 is disposed between the input transistor Trin1 and the power supply voltage VCCQ. The transistor Tr6 is connected in series to the input transistor Trin1. The transistor Tr6 forms a current mirror circuit with the transistor Tr4. A gate of the transistor Tr6 is connected to the bias line NN and a drain of the transistor Tr6. The drain of the transistor Tr6 is connected to the node N1. Thus, a drain current corresponding to a mirror ratio determined by a ratio between a dimension of the transistor Tr6 and a dimension of the transistor Tr4 appears on the drain side of the transistor Tr4 with respect to a drain current (that is, a current flowing through the node N1) of the transistor Tr6.

The auxiliary circuit AS12 has a transistor Tr18. The transistor Tr18 may be configured with a PMOS transistor. The transistor Tr18 is disposed between the input transistor Trin2 and the power supply voltage VCCQ. The transistor Tr18 is connected in series to the input transistor Trin2. A gate of the transistor Tr18 is connected to a drain thereof. The drain of the transistor Tr18 is connected to the node N2.

The differential amplification circuit 20 includes a differential circuit DIFF2, a pre-emphasis circuit PE2, a load circuit LD2, an auxiliary circuit AS21, an auxiliary circuit AS22, and a transmission circuit TR2. The differential circuit DIFF2 is disposed between the load circuit LD2 and the power supply voltage VCCQ. The pre-emphasis circuit PE2 is disposed between the differential circuit DIFF2 and the power supply voltage VCCQ. The load circuit LD2 is disposed between the differential circuit DIFF2 and the ground voltage. The load circuit LD2 is configured with a circuit (cross-coupled circuit) in which gates and drains of two transistors are cross-coupled.

The transmission circuit TR2 has a transistor Tr15 as a fifteenth transistor. The transistor Tr15 may be configured with an NMOS transistor. The transistor Tr15 has a gate connected to the auxiliary circuit AS21 via a bias line NP. The transistor Tr15 also has a drain connected to the output circuit 30 and a source connected to the ground voltage.

The differential circuit DIFF2 has an input transistor Trin3 as a third input transistor, an input transistor Trin4 as a fourth input transistor, and a current source CS2. The input transistor Trin3 and the input transistor Trin4 configure a differential pair. Each of the input transistor Trin3 and the input transistor Trin4 may be configured with a PMOS transistor. The input transistor Trin3 has a gate receiving the input signal VIN, a drain electrically connected to the node N3, and a source electrically connected to one end of the current source CS2. The input transistor Trin4 has a gate receiving reference signal VREF, a drain electrically connected to the node N4, and a source electrically connected to one end of the current source CS2. The other end of the current source CS2 is electrically connected to the power supply voltage VCCQ.

The pre-emphasis circuit PE2 has a transistor Tr12 as a twelfth transistor and a transistor Tr13 as a thirteenth transistor. The transistor Tr12 is connected in parallel to the source of the input transistor Trin3 and the source of the input transistor Trin4 along with the current source CS2. The transistor Tr13 is connected in series to the transistor Tr12. Each of the transistor Tr12 and the transistor Tr13 may be configured with a PMOS transistor. The transistor Tr12 has a gate receiving input signal VIN, a drain electrically connected to the source of the input transistor Trin3 and the source of the input transistor Trin4, and a source electrically connected to the transistor Tr13. The transistor Tr13 has a gate receiving the signal HVON, a source electrically connected to the power supply voltage VCCQ, and a drain electrically connected to the transistor Tr12.

The load circuit LD2 has a transistor Tr20 and a transistor Tr21. Gates and drains of the transistor Tr20 and the transistor Tr21 are cross-coupled. Each of the transistor Tr20 and the transistor Tr21 may be configured with a PMOS transistor. The transistor Tr20 has a gate connected to the gate and the drain of the transistor Tr21, a drain electrically connected to the node N3, and a source electrically connected to the ground voltage. The transistor Tr21 has a gate connected to the drain and the gate of the transistor Tr20, a drain electrically connected to the node N4, and a source electrically connected to the ground voltage.

The auxiliary circuit AS21 has a transistor Tr17 as a seventeenth transistor. The transistor Tr17 may be configured with an NMOS transistor. The transistor Tr17 is disposed between the input transistor Trin3 and the ground voltage. The transistor Tr17 is connected in series to the input transistor Trin3. The transistor Tr17 forms a current mirror circuit with the transistor Tr15. A gate of the transistor Tr17 is connected to the bias line NP and a drain of the transistor Tr17. The drain of the transistor Tr17 is connected to the node N3. Thus, a drain current corresponding to a mirror ratio determined by a ratio between a dimension of the transistor Tr17 and a dimension of the transistor Tr15 appears on the drain side of the transistor Tr15 with respect to a drain current (that is, a current flowing through the node N3) of the transistor Tr17.

The auxiliary circuit AS22 has a transistor Tr23. The transistor Tr23 may be configured with an NMOS transistor. The transistor Tr23 is disposed between the input transistor Trin4 and the ground voltage. The transistor Tr18 is connected in series to the input transistor Trin4. A gate of the transistor Tr23 is connected to a drain thereof. The drain of the transistor Tr23 is connected to the node N4.

The output circuit 30 has a plurality of inverters INV1-1 and INV1-2. A plurality of inverters INV1-1 and INV1-2 are disposed on an output line Lout. The output line Lout extends from the drains of the transistors Tr4 and Tr15 to the output node Nout. An input node of the inverter INV1-1 is connected to the drains of the transistors Tr4 and Tr15, and an output node thereof is connected to the inverter INV1-2. The inverter INV1-1 receives the signal HVO with the input node thereof. An input node of the inverter INV1-2 is connected to the inverter INV1-1, and an output node thereof is connected to an output node Nout of the semiconductor device 1. The inverters INV1-1 and INV1-2 logically invert the signal HVO an even number of times (for example, twice) to generate and output the output signal OUT.

The control circuit 40 has an inverter INV3. An input node of the inverter INV3 is connected to the drains of the transistors Tr4 and Tr15, and an output node thereof is connected to the gates of the transistors Tr2 and Tr13. The inverter INV3 receives the signal HVO with the input node thereof. The inverter INV3 logically inverts a level of the signal HVO to generate the signal HVON and supplies the signal HVON to the gates of the transistors Tr2 and Tr13.

Figure 2:
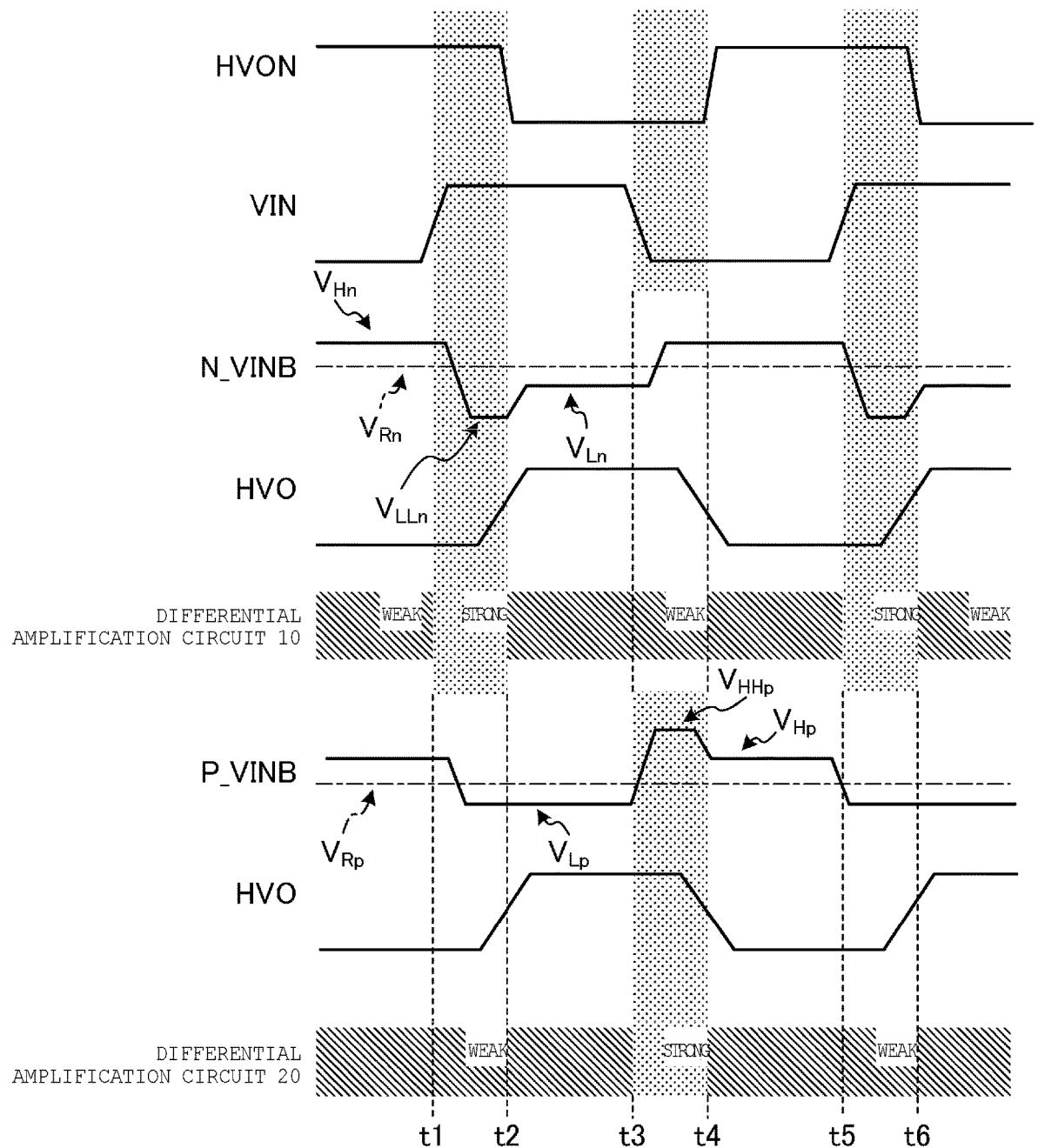
FIG. 2 is a waveform diagram showing an operation of the semiconductor device according to the first embodiment.

In the semiconductor device 1, as shown in FIG. 2, waveforms of the internal signals N_VINB and P_VINB are formed into an undershoot waveform and an overshoot waveform by the pre-emphasis circuits PE1 and PE2. The internal signals N_VINB and P_VINB are signals on the bias lines NN and NP in the differential amplification circuits 10 and 20. FIG. 2 is a waveform diagram showing an operation of the semiconductor device 1.

The signal HVON has an H level and the input signal VIN has an L level right before timing t1.

Therefore, in the differential amplification circuit 10, the transistor Tr1 is turned off such that the pre-emphasis circuit PE1 is in an inactive state, and a current with a current amount I1 flows through a common source node COMN of the input transistors Trin1 and Trin2. I1 is an amount of a current generated by the current source CS1.

In the differential amplification circuit 20, the transistor Tr13 is turned offs such that the pre-emphasis circuit PE2 is in an inactive state, a current with a current amount I2 flows through a common source node COMP of the input transistors Trin3 and Trin4. I2 is an amount of a current generated by the current source CS2.

At timing t1, the input signal VIN changes from the L level to the H level while the signal HVON is maintained in the H level.

Therefore, in the differential amplification circuit 10, the transistors Tr1 and Tr2 are turned on such that the pre-emphasis circuit PE1 is brought into an active state, and a current with a current amount I1+ΔIpe1 (>I1) flows through the common source node COMN. ΔIpe1 is an amount of a current generated by the pre-emphasis circuit PE1. Thus, the pre-emphasis circuit PE1 emphasizes an L level amplitude of the internal signal N_VINB when the internal signal N_VINB transitions from the H level to the L level.

That is, the internal signal N_VINB transitions from an H level $V_{Hn}$ to an amplitude-emphasized L level $V_{LLn}$. When an intermediate value between the H level $V_{Hn}$ and the L level $V_{Ln}$ is set to a reference value $V_{Rn}$, a difference between the amplitude-emphasized L level $V_{LLn}$ and the reference value $V_{Rn}$ is greater than a difference between the H level $V_{Hn}$ and the reference value $V_{Rn}$. In FIG. 2, a period in which the L level amplitude of the internal signal N_VINB of the differential amplification circuit 10 is emphasized is indicated by "strong", and a period in which the L level amplitude of the internal signal N_VINB is not emphasized is indicated by "weak".

In the differential amplification circuit 20, the transistors Tr11 and Tr12 are turned off such that the pre-emphasis circuit PE2 is maintained in an inactive state, and the current with the current amount I2 flows through the common source node COMP. Consequently, the internal signal P_VINB transitions from an H level $V_{Hp}$ to an L level $V_{Lp}$, but the L level amplitude is not emphasized.

At timing t2, the signal HVON changes from the H level to the L level while the input signal VIN is maintained in the H level.

Therefore, in the differential amplification circuit 10, the transistor Tr2 is turned off such that the pre-emphasis circuit PE1 returns to an inactive state, and the current with the current amount I1 flows through the common source node COMN. Consequently, the pre-emphasis circuit PE1 cancels the emphasis on the L level amplitude of the internal signal N_VINB.

That is, the internal signal N_VINB changes from the L level $V_{LLn}$ in which the amplitude is emphasized to the L level $V_{Ln}$ in which the emphasis on the amplitude is canceled. A difference between the emphasis-canceled L level $V_{Ln}$ in which the emphasis on the amplitude is canceled and the reference value $V_{Cn}$ is substantially equivalent to a difference between the H level $V_{Hn}$ and the reference value $V_{Cn}$. Thus, a waveform of the internal signal N_VINB is formed into an undershoot waveform by the pre-emphasis circuit PE1. Consequently, a drive force of the transistor Tr4 of the transmission circuit TR1 is temporarily pulled up at the time of level transition, and thus a slope of the signal HVO that is output from the differential amplification circuit 10 to the output circuit 30 at the time of level transition is steep.

In the differential amplification circuit 20, the transistors Tr11 and Tr12 are turned off such that the pre-emphasis circuit PE2 is maintained in an inactive state, and the current with the current amount I2 flows through the common source node COMP. Thus, a waveform of the internal signal P_VINB is not formed into an undershoot waveform, and thus a slope of the signal HVO that is output from the differential amplification circuit 20 to the output circuit 30 at the time of level transition is not steep.

In the period from timing t1 to timing t2, a slope of the signal HVO output from the differential amplification circuit 10 to the output circuit 30 at the time of level transition is steep. Consequently, a slope of the output signal OUT generated by the output circuit 30 at the time of level transition according to the signal HVO is also steep.

Right before timing t3, the signal HVON has the L level and the input signal VIN has the H level.

Therefore, in the differential amplification circuit 10, the transistor Tr2 is turned off such that the pre-emphasis circuit PE1 is in an inactive state, and the current with the current amount I1 flows through the common source node COMN of the input transistor Trin1 and Trin2.

In the differential amplification circuit 20, the transistor Tr12 is turned off such that the pre-emphasis circuit PE2 is in an inactive state, and the current with the current amount I2 flows through the common source node COMP of the input transistors Trin3 and Trin4.

At timing t3, the input signal VIN changes from the H level to the L level while the signal HVON is maintained in the L level.

Therefore, in the differential amplification circuit 20, the transistors Tr12 and Tr13 are turned on such that the pre-emphasis circuit PE2 is brought into an active state, and the current wherein the current amount I2+ΔIpe2 (>I2) flows through the common source node COMP. ΔIpe2 is an amount of a current generated by the pre-emphasis circuit PE2. Consequently, the pre-emphasis circuit PE2 emphasizes the H level amplitude of the internal signal P_VINB when the internal signal P_VINB transitions from the L level to the H level.

That is, the internal signal P_VINB transitions from the L level $V_{Lp}$ to the amplitude-emphasized H level $V_{HHp}$. When an intermediate value between H level $V_{Hp}$ and L level $V_{Lp}$ is set to a reference value $V_{Cp}$, a difference between an amplitude-emphasized H level $V_{HHp}$ and a reference value $V_{Cp}$ is greater than a difference between an L level $V_{Lp}$ and a reference value $V_{Cp}$. In FIG. 2, a period in which the H level amplitude of the internal signal P_VINB of the differential amplification circuit 20 is emphasized is indicated by "strong", and a period in which the H level amplitude of the internal signal P_VINB is not emphasized is indicated by "weak".

In the differential amplification circuit 10, the transistors Tr1 and Tr2 are turned off such that the pre-emphasis circuit PE1 is maintained in an inactive state, and the current with the current amount I1 flows through the common source node COMN. Consequently, the internal signal N_VINB transitions from the L level $V_{Ln}$ to the H level $V_{Hn}$, but the H level amplitude is not emphasized.

At timing t4, the signal HVON changes from the L level to the H level while the input signal VIN is maintained in the L level.

Therefore, in the differential amplification circuit 20, the transistor Tr13 is turned off such that the pre-emphasis circuit PE2 returns to an inactive state, and the current with the current amount I2 flows through the common source node COMP. Consequently, the pre-emphasis circuit PE2 cancels the emphasis on the H level side of the H level amplitude of the internal signal P_VINB.

That is, the internal signal P_VINB changes from H level $V_{HHp}$ of the amplitude is emphasized to the H level $V_{Hp}$ in which the emphasis on the amplitude is canceled. A difference between the H level $V_{Hp}$ in which the emphasis on the amplitude is canceled and the reference value $V_{Cp}$ is substantially equivalent to a difference between the L level $V_{Lp}$ and the reference value $V_{Cp}$. Therefore, a waveform of the internal signal P_VINB is formed into an overshoot waveform. Consequently, a drive force of the transistor Tr15 of the transmission circuit TR2 is temporarily pulled up at the time of level transition, and thus a slope of the signal HVO that is output from the differential amplification circuit 20 to the output circuit 30 at the time of level transition is steep.

In the differential amplification circuit 10, the transistor Tr1 is turned off such that the pre-emphasis circuit PE1 is maintained in an inactive state, and the current with the current amount I1 flows through the common source node COMN. Therefore, a waveform of the internal signal N_VINB is not formed into an overshoot waveform.

In the period from timing t3 to timing t4, a slope of the signal HVO output from the differential amplification circuit 20 to the output circuit 30 at the time of level transition is steep. Consequently, a slope of the output signal OUT generated by the output circuit 30 at the time of level transition according to the signal HVO is also steep.

At timings t5 and t6, the same operation as at timings t1 and t2 is performed.

As shown in FIG. 1, the signal HVO is inverted in polarity and is fed back to the pre-emphasis circuits PE1 and PE2 as the signal HVON. Consequently, as shown in FIG. 2, the pre-emphasis circuits PE1 and PE2 temporarily increase a drive current corresponding to the amplitude of the internal signal of the differential amplification circuit 10 when the input signal VIN transitions from the L level to the H level, and thus pull up the drive force of the transmission circuit TR1. When the input signal VIN transitions from the H level to the L level, a drive current corresponding to the amplitude of the internal signals of the differential amplification circuit 20 is temporarily increased to pull up the drive force of the transmission circuit TR2. Thus, the drive forces of the differential amplification circuits 10 and 20 at the time of level transition can be increased with high current efficiency.

As described above, in the first embodiment, the pre-emphasis circuits PE1 and PE2 are respectively added to the differential amplification circuits 10 and 20 in the semiconductor device 1. The pre-emphasis circuits PE1 and PE2 form waveforms of the internal signals of the differential amplification circuits 10 and 20 into an undershoot waveform and an overshoot waveform by emphasizing the amplitudes at the time of level transition. Consequently, the transition of the signal level can be speeded up while reducing a time average amplitude, and an operation frequency of the semiconductor device 1 can be pulled up with high current efficiency. Consequently, it is possible to achieve both reduction in power consumption and a high speed.

Second Embodiment

Next, a semiconductor device to a second embodiment will be described. Hereinafter, a description will focus on differences from the first embodiment.

In the first embodiment, waveforms of the internal signals of the differential amplification circuits 10 and 20 are formed into an undershoot waveform and an overshoot waveform by emphasizing amplitudes at the time of level transition, but, in the second embodiment, waveforms of internal signals of differential amplification circuits 110 and 120 are formed into an undershoot waveform and an overshoot waveform by attenuating amplitudes thereof after level transition.

Figure 3:
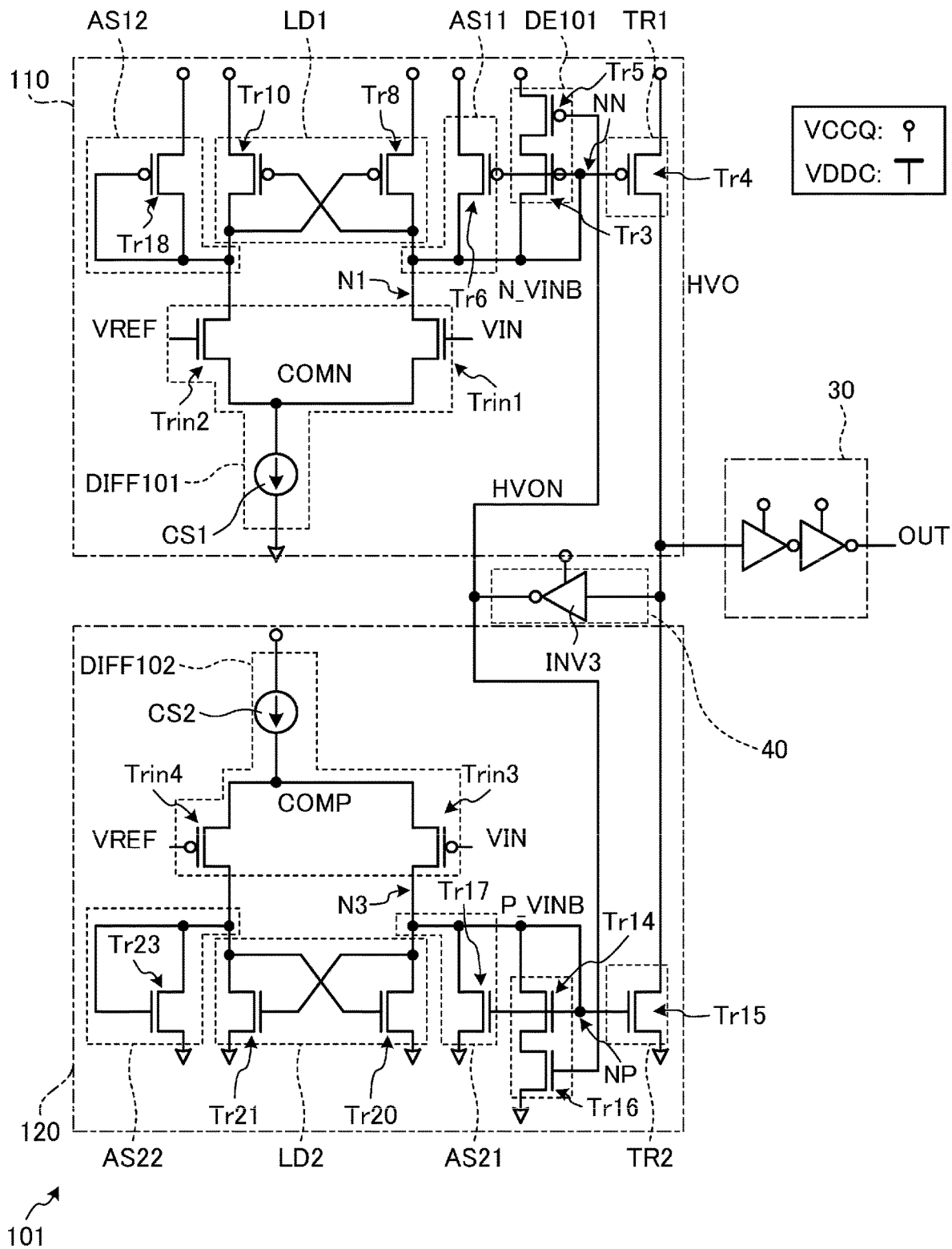
FIG. 3 is a circuit diagram showing a configuration of a semiconductor device according to a second embodiment.

Specifically, a semiconductor device 101 may be configured as shown in FIG. 3. FIG. 3 is a diagram showing a configuration of the semiconductor device 101. The semiconductor device 101 has a differential amplification circuit 110 and a differential amplification circuit 120 instead of the differential amplification circuit 10 and the differential amplification circuit 20 (refer to FIG. 1). The differential amplification circuit 110 has a de-emphasis circuit DE101 instead of the pre-emphasis circuit PE1 (refer to FIG. 1), and the differential amplification circuit 120 has a de-emphasis circuit DE102 instead of the pre-emphasis circuit PE2 (refer to FIG. 1).

The differential amplification circuit 110 amplifies a difference between an input signal VIN and a reference signal VREF by using a power supply voltage VCCQ, and generates a signal HVO in cooperation with the differential amplification circuit 120. In this case, the de-emphasis circuit DE101 forms a waveform of an internal signal of the differential amplification circuit 110 into an undershoot waveform. Thus, a slope of the signal HVO at the time of level transition can be steepened.

The differential amplification circuit 120 amplifies a difference between the input signal VIN and the reference signal VREF by using the power supply voltage VCCQ, and generates the signal HVO in cooperation with the differential amplification circuit 110. In this case, the de-emphasis circuit DE102 shapes a waveform of an internal signal of the differential amplification circuit 120 into an overshoot waveform. Thus, a slope of the signal HVO at the time of level transition can be steepened.

The output circuit 30 receives the signal HVO from the differential amplification circuit 110 and the differential amplification circuit 120, and generates and outputs an output signal OUT corresponding to the signal HVO. In this case, a slope of the signal HVO at the time of level transition can be steepened. Since the slope of the signal HVO at the level transition can be steepened, a slope of the output signal OUT at the time of level transition can also be steepened.

The de-emphasis circuit DE101 has a transistor Tr3 and a transistor Tr5. The transistor Tr3 is connected in parallel to the drain of the input transistor Trin1 along with transistors Tr6 and Tr8. The transistor Tr5 is connected between the transistor Tr3 and the power supply voltage VCCQ. The transistor Tr5 is connected in series to the transistor Tr3. Each of the transistor Tr3 and the transistor Tr5 may be configured with a PMOS transistor.

The transistor Tr5 has a gate receiving the signal HVON, a drain electrically connected to a source of the transistor Tr3, and a source electrically connected to the power supply voltage VCCQ.

The transistor Tr3 forms a current mirror circuit with the transistor Tr4. A gate of the transistor Tr3 is connected to the bias line NN and the drain of the transistor Tr3. The drain of the transistor Tr3 is connected to the node N1.

In the de-emphasis circuit DE101, during a period in which the signal HVON has the L level, a drain current corresponding to a mirror ratio determined by a ratio between a dimension of the transistor Tr3 and a dimension of the transistor Tr4 dimension additionally appears on the drain side of the transistor Tr4 with respect to a drain current of the transistor Tr3. For example, the de-emphasis circuit DE101 causes an additional drain current that attenuates an L level amplitude of a signal to appear on the drain side of the transistor Tr4.

The de-emphasis circuit DE102 has a transistor Tr14 as a fourteenth transistor and a transistor Tr16 as a sixteenth transistor. The transistor Tr14 is connected in parallel to the drain of the input transistor Trin3 along with the transistors Tr17 and Tr20. The transistor Tr16 is connected between the transistor Tr14 and the ground voltage. The transistor Tr16 is connected in series to the transistor Tr14. Each of the transistor Tr14 and the transistor Tr16 may be configured with an NMOS transistor.

The transistor Tr16 has a gate receiving the signal HVON, a drain electrically connected to a source of the transistor Tr14, and a source electrically connected to the ground voltage.

The transistor Tr14 forms a current mirror circuit with the transistor Tr15. A gate of the transistor Tr14 is connected to the bias line NP and a drain of the transistor Tr14. The drain of the transistor Tr14 is connected to the node N1.

In the de-emphasis circuit DE102, during a period in which the signal HVON has the H level, a drain current corresponding to a mirror ratio determined by a ratio between a dimension of the transistor Tr14 and a dimension of the transistor Tr15 additionally appears on the drain side of the transistor Tr15 with respect to a drain current of the transistor Tr14. For example, the de-emphasis circuit DE102 causes an additional drain current that attenuates an H level amplitude of a signal to appear on the drain side of the transistor Tr15.

Figure 4:
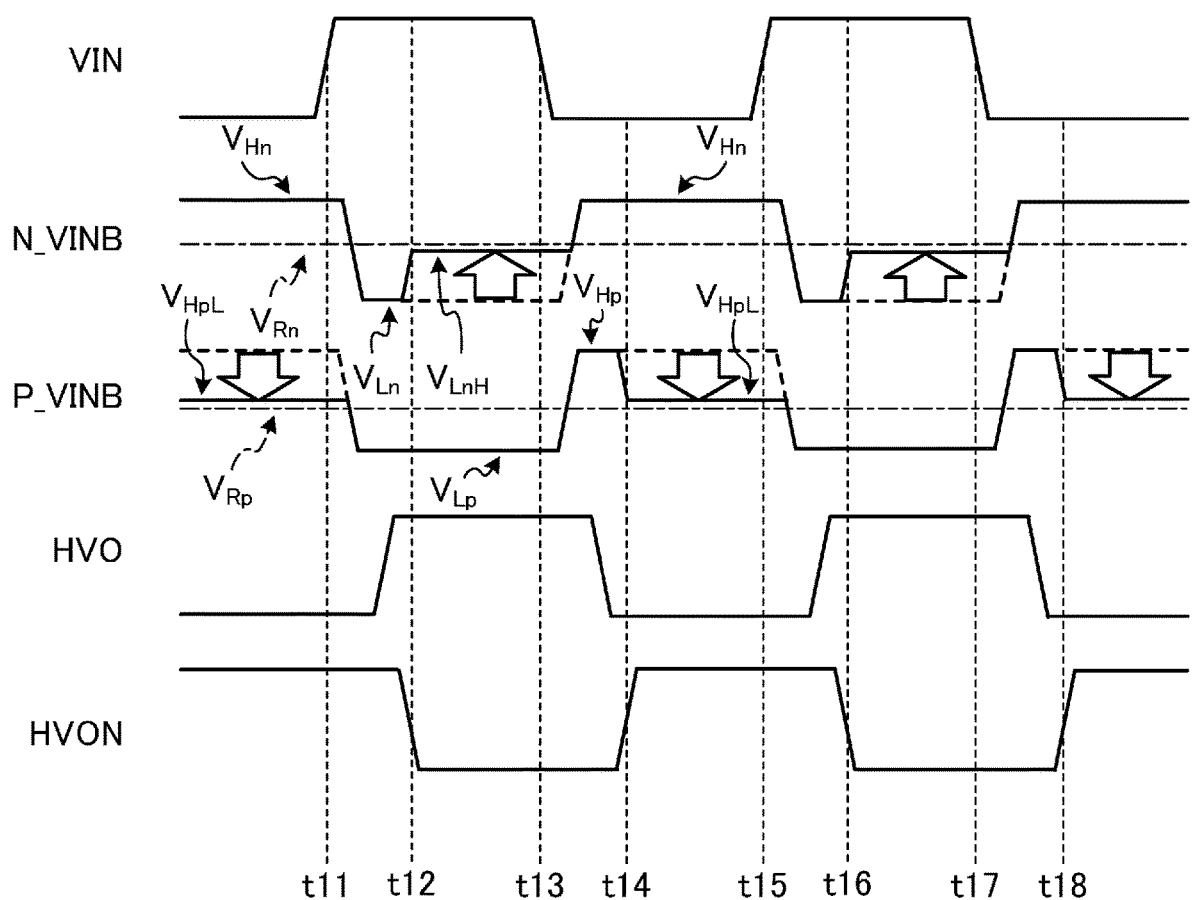
FIG. 4 is a waveform diagram showing an operation of the semiconductor device to the second embodiment.

In the semiconductor device 101, as shown in FIG. 4, waveforms of the internal signals N_VINB and P_VINB are formed into an undershoot waveform and an overshoot waveform by the de-emphasis circuits DE101 and DE102. The internal signals N_VINB and P_VINB are signals on the bias lines NN and NP in the differential amplification circuits 110 and 120. FIG. 4 is a waveform diagram showing an operation of the semiconductor device 101.

At timing t11, the input signal VIN changes from the L level to the H level while the signal HVON is maintained in the H level.

Therefore, in the differential amplification circuit 110, the transistor Tr5 is turned off such that the de-emphasis circuit DE101 is in an inactive state. The internal signal N_VINB transitions from an H level $V_{Hn}$ to an L level $V_{Ln}$ according to transition of the input signal VIN from L level to H level.

In the differential amplification circuit 120, the transistor Tr16 is turned on such that the de-emphasis circuit DE102 is in the active state. The internal signal P_VINB transitions from an H level $V_{HpL}$ to an L level $V_{Lp}$ according to transition of the input signal VIN from the L level to the H level.

At timing t12 after the input signal VIN transitions from the L level to the H level, the signal HVON changes from the H level to the L level while the input signal VIN is maintained in the H level.

Therefore, in the differential amplification circuit 110, the transistor Tr5 is turned on such that the de-emphasis circuit DE101 brought into an active state and a voltage of the bias line NN is pulled up to the H level side, and thus an L level amplitude of the internal signal N_VINB is attenuated.

That is, the internal signal N_VINB changes from an L level $V_{Ln}$ to an amplitude-attenuated L level $V_{LnH}$. In the amplitude-attenuated L level $V_{LnH}$, the L level amplitude is pulled up to the H level side compared with the L level $V_{Ln}$. When an intermediate value between the H level $V_{Hn}$ and the L level $V_{Ln}$ is set to a reference value $V_{Rn}$, a difference between the amplitude-attenuated L level $V_{LnH}$ and the reference value $V_{Rn}$ is smaller than a difference between H level $V_{Hn}$ and the reference value $V_{Rn}$. Thus, a waveform of the internal signal N_VINB is formed into an undershoot waveform by the de-emphasis circuit DE101. Consequently, when viewed relatively, a drive force of the transistor Tr4 of the transmission circuit TR1 is temporarily pulled up at the time of level transition, and thus a slope of a difference signal VO10 output from the differential amplification circuit 110 to the output circuit 30 at the time of level transition is steeper than that after level transition.

In the differential amplification circuit 120, the transistor Tr16 is turned off such that the de-emphasis circuit DE102 is brought into an inactive state, and the voltage of the bias line NP is not pulled down. Consequently, the internal signal P_VINB is maintained in the L level $V_{Lp}$. Thus, a waveform of the internal signal P_VINB is not formed into an undershoot waveform.

In the period from timing t11 to timing t12, a slope of the signal HVO output from the differential amplification circuit 110 to the output circuit 30 at the time of level transition is steep. Consequently, a slope of the output signal OUT generated by the output circuit 30 at the time of level transition according to the signal HVO is also steep.

At timing t13, the input signal VIN changes from the H level to the L level while the signal HVON is maintained in the L level.

Therefore, in the differential amplification circuit 120, the transistor Tr16 is turned off such that the de-emphasis circuit DE102 is in an inactive state. The internal signal P_VINB transitions from the L level $V_{Lp}$ to the H level $V_{Hp}$ according to transition of the input signal VIN from the H level to the L level.

In the differential amplification circuit 110, the transistor Tr5 is turned on such that the de-emphasis circuit DE101 is in an active state. The internal signal N_VINB transitions from the L level $V_{LnL}$ to the H level $V_{Hn}$ according to transition of the input signal VIN from the H level to the L level.

At timing t14 after the input signal VIN transitions from the H level to the L level, the signal HVON changes from the L level to the H level while the input signal VIN is maintained in the L level.

Therefore, in the differential amplification circuit 120, the transistor Tr16 is turned on, the de-emphasis circuit DE102 is brought into an active state and a voltage of the bias line NP is pulled down to the L level side, and an H level amplitude of the internal signal P_VINB is attenuated.

That is, the internal signal P_VINB changes from the H level $V_{Hp}$ to an amplitude-attenuated H level $V_{HpL}$. In the H level $V_{HpL}$, the H level amplitude is pulled down to the L level side compared with the H level $V_{Hp}$. When an intermediate value between the L level $V_{Lp}$ and H level $V_{Hp}$ is set to a reference value $V_{Rp}$, a difference between the amplitude is attenuated H level $V_{HpL}$ and the reference value $V_{Rp}$ is smaller than a difference between the L level $V_{Lp}$ and the reference value $V_{Rp}$. Thus, a waveform of the internal signal P_VINB is formed into an overshoot waveform by the de-emphasis circuit DE102. Consequently, when viewed relatively, a drive force of the transistor Tr15 of the transmission circuit TR2 is temporarily pulled up at the time of level transition, and thus a slope of the signal HVO output from the differential amplification circuit 120 to the output circuit 30 at the time of level transition is steeper than that after level transition.

In the differential amplification circuit 110, the transistor Tr5 is turned off such that the de-emphasis circuit DE101 is brought into an inactive state, and the voltage of the bias line NN is not pulled down. Consequently, the internal signal N_VINB is maintained in the H level $V_{Hn}$. Therefore, a waveform of the internal signal N_VINB is not formed into an overshoot waveform.

In the period from timing t13 to timing t14, a slope of the signal HVO output from the differential amplification circuit 120 to the output circuit 30 at the time of level transition is steep. Consequently, a slope of the output signal OUT generated by the output circuit 30 at the time of level transition according to the signal HVO is also steep.

At timings t15 and t16, the same operation as that at timings t11 and t12 is performed.

At timings t17 and t18, the same operation as that at timings t13 and t14 is performed.

As shown in FIG. 3, the signal HVO is inverted in polarity and is fed back to the de-emphasis circuits DE101 and DE102 as the signal HVON. Consequently, as shown in FIG. 4, the de-emphasis circuits DE101 and DE102 temporarily reduce a drive current corresponding to the amplitude of the internal signal of the differential amplification circuit 110 after the input signal VIN transitions from the L level to the H level, and thus pulls down a drive force of the transmission circuit TR1. After the input signal VIN transitions from the H level to the L level, a drive current corresponding to the amplitude of the internal signal of the differential amplification circuit 120 is temporarily reduced to pull down the drive force of the transmission circuit TR2. Consequently, the drive forces of the differential amplification circuits 110 and 120 at the time of level transition can be relatively increased.

As described above, in the second embodiment, in the semiconductor device 101, the de-emphasis circuits DE101 and DE102 are respectively added to the differential amplification circuits 110 and 120. The de-emphasis circuits DE101 and DE102 form waveforms of the internal signals of the differential amplification circuits 110 and 120 into an undershoot waveform and an overshoot waveform by attenuating the amplitude after the level transition. Consequently, the transition of the signal level can be speeded up while reducing a time average amplitude, and an operation frequency of the semiconductor device 101 can be pulled up with high current efficiency. Consequently, it is possible to achieve both reduction in power consumption and a high speed.

Third Embodiment

Next, a semiconductor device to a third embodiment will be described. Hereinafter, a description will focus on differences from the first embodiment and the second embodiment.

In the second embodiment, waveforms of the internal signals of the differential amplification circuits 110 and 120 are formed into an undershoot waveform and an overshoot waveform, but, in the third embodiment, a waveform of a signal HVO synthesized from difference signals VO10 and VO20 of differential amplification circuits 210 and 220 is formed into an undershoot waveform and an overshoot waveform.

Figure 5:
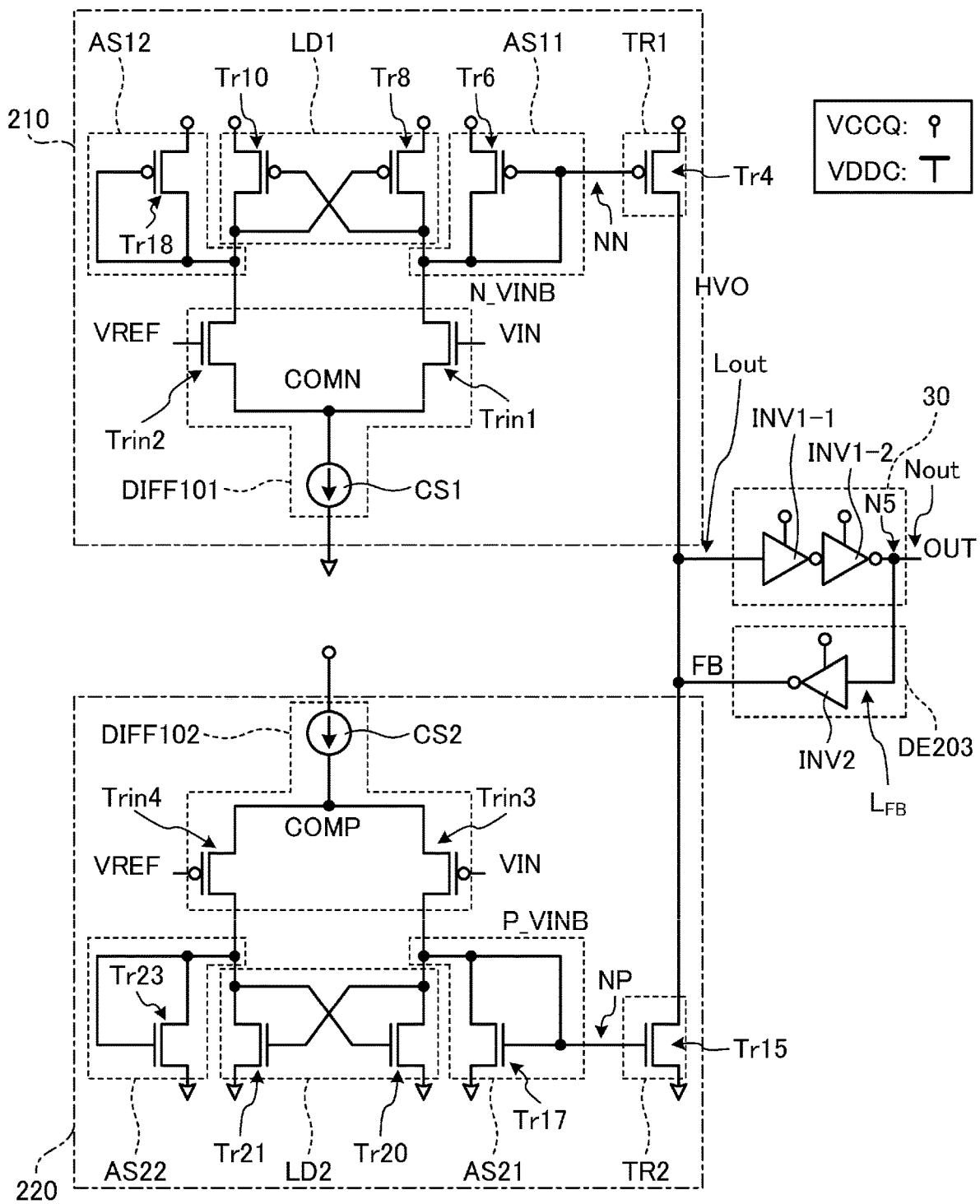
FIG. 5 is a circuit diagram showing a configuration of a semiconductor device according to a third embodiment.

Specifically, a semiconductor device 201 may be configured as shown in FIG. 5. FIG. 5 is a diagram showing a configuration of the semiconductor device 201. The semiconductor device 201 has a differential amplification circuit 210 and a differential amplification circuit 220 instead of the differential amplification circuit 110 and the differential amplification circuit 120 (refer to FIG. 3), and further has a de-emphasis circuit DE203. The differential amplification circuit 210 and the differential amplification circuit 220 are configured, respectively, by omitting the de-emphasis circuit DE101 and de-emphasis circuit DE102 from the differential amplification circuit 110 and the differential amplification circuit 120.

The output circuit 30 receives the signal HVO from the differential amplification circuit 210 and the differential amplification circuit 220, and generates and outputs an output signal OUT corresponding to the signal HVO. In this case, the de-emphasis circuit DE203 generates a signal FB according to the output signal OUT, feeds the signal FB back to the input node of the output circuit 30, and attenuates an amplitude of the signal HVO after level transition. Consequently, the de-emphasis circuit DE203 forms a waveform of the signal HVO into an undershoot waveform and an overshoot waveform. Consequently, a slope of the signal HVO at the time of level transition can be steepened. Since the slope of the signal HVO at the level transition can be steepened, a slope of the output signal OUT at the time of level transition can also be steepened.

The de-emphasis circuit DE203 is disposed between the output circuit 30, and the differential amplification circuit 210 and the differential amplification circuit 220. The de-emphasis circuit DE203 has one or more inverters INV2. The inverter INV2 is disposed on a feedback line $L_{FB}$. The feedback line $L_{FB}$ extends from the node N5 on the output line Lout to the drains of the transistors Tr4 and Tr15. The de-emphasis circuit DE203 includes the inverters INV2 in such a number that a total number of the inverters INV1 and INV2 through which a feedback loop passes is an odd number. The feedback loop is a loop including a portion from one end of the output line Lout from to the node N5 and the feedback line $L_{FB}$. An input node of the inverter INV2 is connected to the node N5, and an output node thereof is connected to the drains of the transistors Tr4 and Tr15.

A drive force of the inverter INV2 is smaller than a drive force of each of the transistors Tr4 and Tr15 of the transmission circuits TR1 and TR2. Consequently, when the de-emphasis circuit DE203 feeds back the signal FB logically inverted from the signal HVO to attenuate an amplitude of the signal HVO, it is possible to preventing excessive attenuation of the amplitude of the signal HVO and thus to prevent oscillation due to feedback.

Figure 6A:
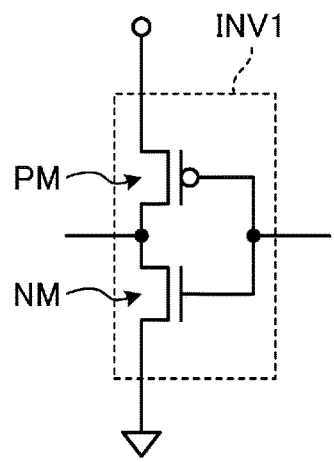
FIGS. 6A to 6C are circuit diagrams showing configurations of inverters according to the third embodiment.
Figure 6B:
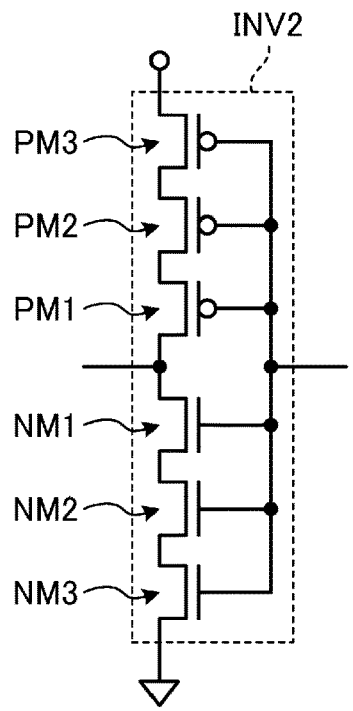
Figure 6C:
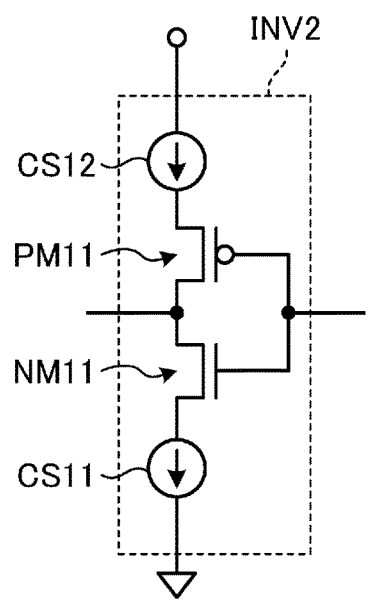

For example, when the inverter INV1 is configured as shown in FIG. 6A, the inverter INV2 may be configured as shown in FIG. 6B or FIG. 6C. FIG. 6A is a circuit diagram showing a configuration of the inverter INV1, and FIGS. 6B and 6C are circuit diagrams showing configurations of the inverter INV2.

The inverter INV1 shown in FIG. 6A has an N-type transistor NM and a P-type transistor PM. The transistor NM is connected between the transistor PM and the ground voltage, and the transistor PM is connected between the power supply voltage VCCQ and the transistor NM. The transistor NM is, for example, an NMOS transistor, has a source connected to the ground voltage, a drain connected to an output node of the inverter INV1, and a gate connected to an input node of the inverter INV1. The transistor PM is, for example, a PMOS transistor, and has a source connected to the power supply voltage VCCQ, a drain connected to the output node of the inverter INV1, and a gate connected to the input node of the inverter INV1.

The inverter INV2 shown in FIG. 6B has a plurality of N-type transistors NM1 to NM3 and a plurality of P-type transistors PM1 to PM3. The plurality of transistors NM1 to NM3 are connected in series between the transistors PM1 to PM3 and the ground voltage, and the plurality of transistors PM1 to PM3 are connected in series between the power supply voltages VCCQ and the transistors NM1 to NM3. Each of the transistor NM1 to NM3 is, for example, an NMOS transistor, and a dimension (=L/W, L: gate length, and W: gate width) of each of the transistor NM1 to NM3 may be equivalent to a dimension of the transistor NM. The transistor NM1 has a source connected to the transistor NM2, a drain connected to the output node of the inverter INV1, and a gate connected to the input node of the inverter INV1. The transistor NM2 has a source connected to the transistor NM3, a drain connected to the transistor NM1, and a gate connected to the input node of the inverter INV1. The transistor NM3 has a source connected to the ground voltage, a drain connected to the transistor NM2, and a gate connected to the input node of the inverter INV1. Each of the transistors PM1 to PM3 is, for example, a PMOS transistor, and a dimension of each of the transistors PM1 to PM3 may be equivalent to a dimension of the transistor PM. The transistor PM1 has a source connected to the transistor PM2, a drain connected to the output node of the inverter INV1, and a gate connected to the input node of the inverter INV1. The transistor PM2 has a source connected to the transistor PM3, a drain connected to the transistor PM1, and a gate connected to the input node of the inverter INV1. The transistor PM3 has a source connected to the power supply voltage VCCQ, a drain connected to the transistor PM2, and a gate connected to the input node of the inverter INV1.

In the inverter INV2 shown in FIG. 6B, the number of N-type transistors connected between the output node and the ground voltage is larger than that in the inverter INV1 shown in FIG. 6A, and the number of P-type transistors connected between the output node and the power supply voltage VCCQ is larger than that in the inverter INV1 shown in FIG. 6A. Consequently, a drive load of each of the N-type transistor and the P-type transistor shown in FIG. 6B is larger than a drive load of each of the N-type transistor and the P-type transistor shown in FIG. 6A, and thus a drive force of the inverter INV2 is smaller than a drive force of the inverter INV1.

The inverter INV2 shown in FIG. 6C has an N-type transistor NM11, a P-type transistor PM11, a current source CS11, and a current source CS12. The transistor NM11 is connected between the transistor PM11 and the current source CS11, and the transistor PM11 is connected between the current source CS12 and the transistor NM11. The current source CS11 is connected between the transistor NM11 and the ground voltage, and the current source CS12 is connected between the power supply voltage VCCQ and the transistor PM11. The transistor NM11 is, for example, an NMOS transistor, and a dimension of the transistor NM11 may be equivalent to a dimension of the transistor NM. The transistor NM11 has a source connected to the current source CS11, a drain connected to the output node of the inverter INV1, and a gate connected to the input node of the inverter INV1. One end of the current source CS11 is connected to the transistor NM11, and the other end thereof is connected to the ground voltage. The transistor PM11 is, for example, a PMOS transistor, and has a source connected to the current source CS12, a drain connected to the output node of the inverter INV1, and a gate connected to the input node of the inverter INV1. One end of the current source CS12 is connected to the transistor PM11, and the other end thereof is connected to the power supply voltage VCCQ.

In the inverter INV2 shown in FIG. 6C, the current source CS11 is connected between the output node and the ground voltage in addition to the N-type transistor, and the current source CS12 is connected between the output node and the power supply voltage VCCQ in addition to the P-type transistor. Consequently, a drive load of each of the N-type transistor and the P-type transistor shown in FIG. 6C is greater than a drive load of each of the N-type transistor and the P-type transistor shown in FIG. 6A, and thus a drive force of the inverter INV2 is smaller than a drive force of the inverter INV1.

Figure 7:
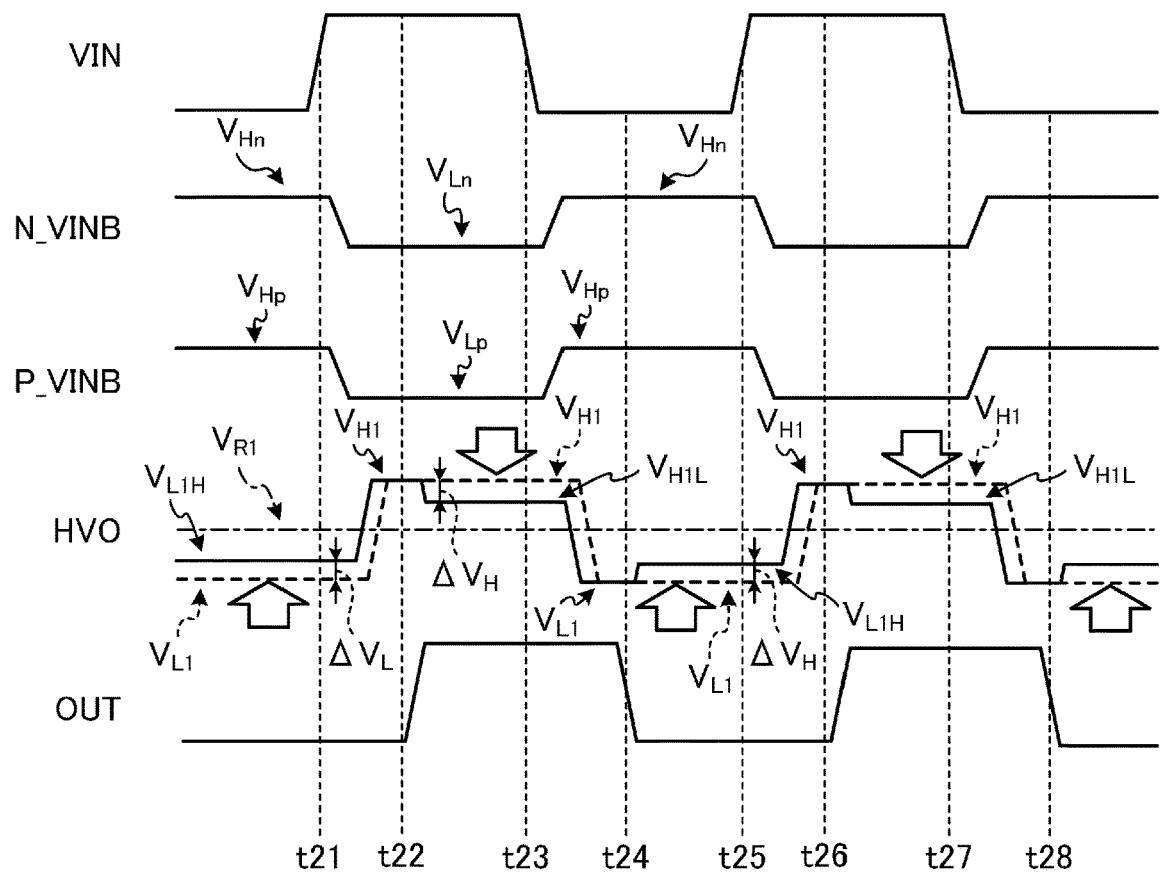
FIG. 7 is a waveform diagram showing an operation of the semiconductor device to the third embodiment.

In the semiconductor device 201, as shown in FIG. 7, a waveform of the signal HVO is formed into an undershoot waveform and an overshoot waveform by the de-emphasis circuit DE203. FIG. 7 is a waveform diagram showing an operation of the semiconductor device 201.

Right before timing t21, the input signal VIN has the L level, and the output signal OUT has the L level.

Therefore, the de-emphasis circuit DE203 generates a signal FB having a positive sign and an absolute amplitude value of $\Delta V_L$ and feeds the signal FB back to the input node of the output circuit 30. In this case, the signal HVO before feedback has an L level $V_{L1}$ indicated by a dotted line in FIG. 7. As indicated by a solid line in FIG. 7, the output circuit 30 adds the signal FB that has been fed back to the signal HVO before feedback, and attenuates an L level amplitude of the signal HVO to $V_{L1}+\Delta V_L=V_{L1H}$. In the amplitude-attenuated L level $V_{L1H}$, the L level amplitude is pulled up to the H level side compared with the L level $V_{L1}$. When an intermediate value between the H level $V_{H1}$ and the L level $V_{L1}$ is set to a reference value $V_{R1}$, a difference between the amplitude-attenuated L level $V_{L1H}$ and the reference value $V_{R1}$ is smaller than a difference between the H level $V_{H1}$ and the reference value $V_{R1}$. The output circuit 30 generates the output signal OUT according to the signal HVO having the L level $V_{L1H}$.

At timing t21, the input signal VIN changes from the L level to the H level while the output signal OUT is maintained in the L level.

Therefore, the internal signal N_VINB in the differential amplification circuit 210 transitions from the H level $V_{Hn}$ to the L level $V_{Ln}$, and the internal signal P_VINB in the differential amplification circuit 220 transitions from the H level $V_{H}p$ to the L level $V_{Lp}$. In response to such transition, the signal HVO transitions from the L level $V_{L1H}$ to the H level $V_{H1}$.

At timing t22, the output signal OUT transitions from the L level to the H level while the input signal VIN is maintained in the H level.

Therefore, the de-emphasis circuit DE203 generates the signal FB having a negative sign and an absolute amplitude value of $\Delta V_H$ and feeds the signal FB back to the input node of the output circuit 30. In this case, the signal HVO before feedback has the H level $V_{H1}$ indicated by the dotted line in FIG. 7. As indicated by the solid line in FIG. 7, the output circuit 30 adds the signal FB that has been fed back to the signal HVO before feedback, and attenuates the H level amplitude of the signal HVO to $V_{H1}-\Delta V_H=V_{H1L}$. In the amplitude-attenuated H level $V_{H1L}$, the H level amplitude is pulled down to the L level side compared with the H level $V_{H1}$. When an intermediate value between the H level $V_{H1}$ and the L level $V_L$ is set to the reference value $V_{R1}$, a difference between the amplitude-attenuated H level $V_{H1L}$ and the reference value $V_{R1}$ is smaller than a difference between the H level $V_{H1}$ and the reference value $V_{R1}$. Thus, a waveform of the signal HVO is formed into an overshoot waveform by the de-emphasis circuit DE203. Consequently, when viewed relatively, a slope of the signal HVO is steeper at the time of level transition than after the level transition, and a slope of the output signal OUT generated by the output circuit 30 at the time of the level transition according to the signal HVO is also steeper.

At timing t23, the input signal VIN changes from the H level to the L level while the output signal OUT is maintained in the H level.

Therefore, the internal signal N_VINB in the differential amplification circuit 210 transitions from the L level $V_{Ln}$ to the H level $V_{Hn}$, and the internal signal P_VINB in the differential amplification circuit 220 transitions from the L level $V_Lp$ to the H level $V_{Hp}$. In response to such transition, the signal HVO transitions from the H level $V_{H1L}$ to the L level $V_{L1}$.

At timing t24, the output signal OUT transitions from the H level to the L level while the input signal VIN is maintained in the L level.

Therefore, the de-emphasis circuit DE203 generates a signal FB having a positive sign and an absolute amplitude value of $\Delta V_L$ and feeds the signal FB back to the input node of the output circuit 30. In this case, the signal HVO before feedback has an L level $V_{L1}$ indicated by a dotted line in FIG. 7. As indicated by a solid line in FIG. 7, the output circuit 30 adds the signal FB that has been fed back to the signal HVO before feedback, and attenuates an L level amplitude of the signal HVO to $V_{L1}+\Delta V_L=V_{L1H}$. In the amplitude-attenuated L level $V_{L1H}$, the L level amplitude is pulled up to the H level side compared with the L level $V_{L1}$. When an intermediate value between the L level $V_{L1}$ and the H level $V_{H1}$ is set to the reference value $V_{R1}$, a difference between the amplitude-attenuated L level $V_{L1H}$ and the reference value $V_{R1}$ is smaller than a difference between the L level $V_{L1}$ and the reference value $V_{R1}$. Therefore, a waveform of the signal HVO is formed into an undershoot waveform by the de-emphasis circuit DE203. Consequently, when viewed relatively, a slope of the signal HVO is steeper at the time of level transition than after the level transition, and a slope of the output signal OUT generated by the output circuit 30 at the time of the level transition according to the signal HVO is also steeper.

At timings t25 and t26, the same operation as that at timings t21 and t22 is performed.

At timings t27 and t28, the same operation as that at timings t23 and t24 is performed.

As shown in FIG. 5, the de-emphasis circuit DE203 reverses a polarity of the output signal OUT and feeds the output signal OUT back to the input node of the output circuit 30 as the signal FB. Consequently, as shown in FIG. 7, the de-emphasis circuit DE203 can temporarily attenuate the H level amplitude of the signal HVO generated by the transistors Tr4 and Tr15 of the transmission circuits TR1 and TR2 after the input signal VIN transitions from the L level to the H level. When the input signal VIN subsequently transitions from the H level to the L level, a drive force for causing the signal HVO to transition from the H level to the L level can be temporarily pulled up. After the input signal VIN transitions from H level to L level, the L level amplitude of the signal HVO generated by the transistors Tr4 and Tr15 of the transmission circuits TR1 and TR2 can be temporarily attenuated. When the input signal VIN subsequently transitions from the L level to the H level, a drive force for causing the signal HVO to transition from the L level to the H level can be temporarily pulled up. Consequently, level transition of the signal HVO can be performed at a high speed.

As described above, in the third embodiment, the de-emphasis circuit DE203 is added to the semiconductor device 201. The de-emphasis circuit DE203 forms a waveform of the signal HVO, which is a source for generating the output signal OUT in the output circuit 30, into an undershoot waveform and an overshoot waveform by attenuating an amplitude thereof after level transition. Consequently, the transition of the signal level can be speeded up while reducing a time average amplitude, and an operation frequency of the semiconductor device 201 can be pulled up with high current efficiency. Consequently, it is possible to achieve both reduction in power consumption and a high speed.

Fourth Embodiment

Next, a semiconductor device to a fourth embodiment will be described. Hereinafter, a description will focus on differences from the first embodiment to the third embodiment.

In the fourth embodiment, the pre-emphasis circuits PE1 and PE2 of the first embodiment, the de-emphasis circuits DE101 and DE102 of the second embodiment, and the de-emphasis circuits DE203 of the third embodiment are combined with each other.

Figure 8:
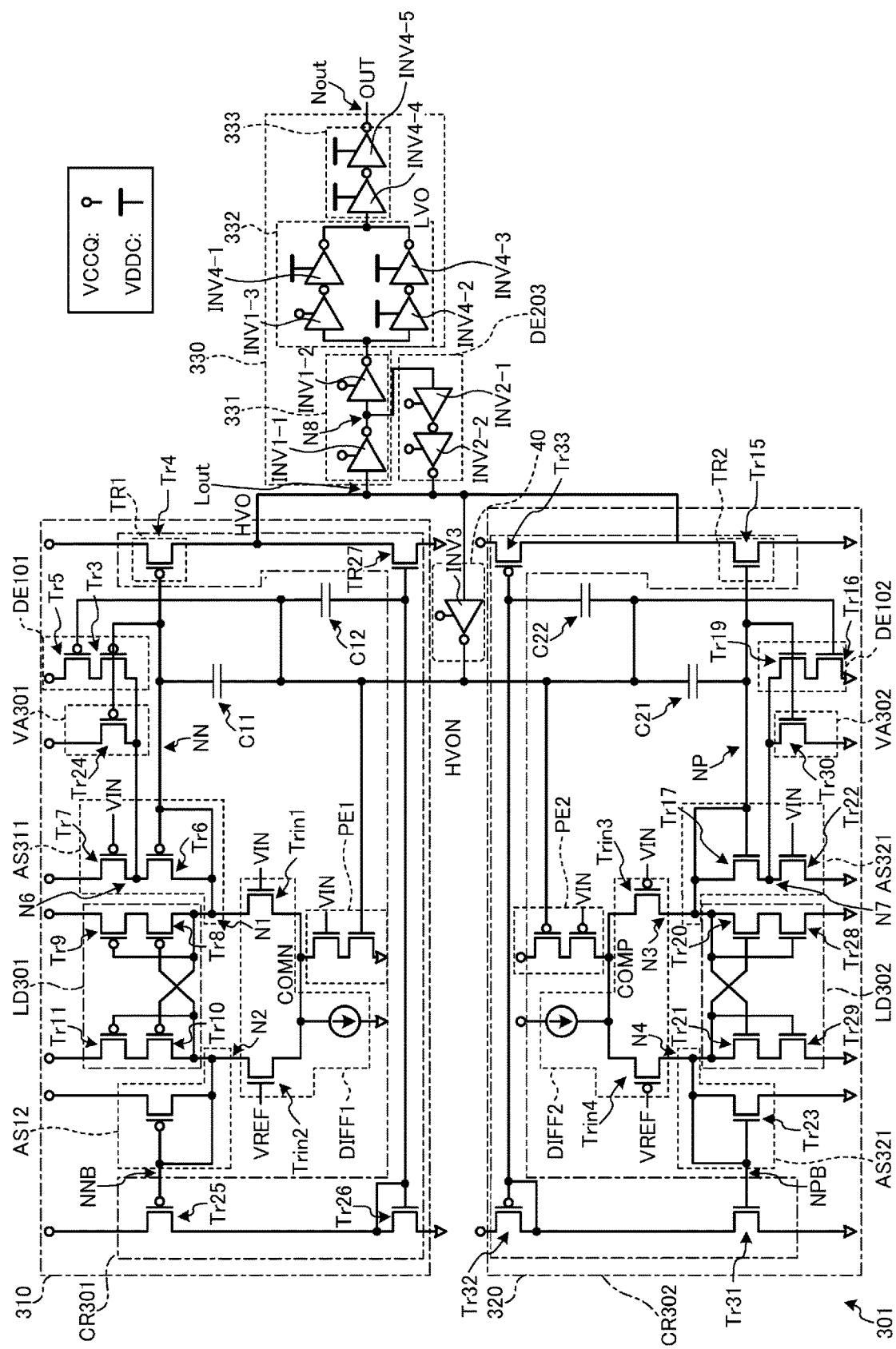
FIG. 8 is a circuit diagram showing a configuration of a semiconductor device according to a fourth embodiment.

Specifically, a semiconductor device 301 may be configured as shown in FIG. 8. FIG. 8 is a diagram showing a configuration of the semiconductor device 301. The semiconductor device 301 has a differential amplification circuit 310, a differential amplification circuit 320, and an output circuit 330 instead of the differential amplification circuit 10, the differential amplification circuit 20, and the output circuit 30 (refer to FIG. 1), and further has a de-emphasis circuit DE203. The differential amplification circuit 310 has a de-emphasis circuit DE101 in addition to the pre-emphasis circuit PE1, and the differential amplification circuit 320 has a de-emphasis circuit DE102 in addition to the pre-emphasis circuit PE2. Functions of the pre-emphasis circuits PE1 and PE2 are the same as those in the first embodiment, and functions of the de-emphasis circuits DE101 and DE102 are the same as those in the second embodiment.

An input node of the de-emphasis circuit DE203 is connected to a node N8 instead of the node N5 (refer to FIG. 5). The node N8 is a node between the inverter INV1-1 and the inverter INV1-2 in the output circuit 330. The number of inverters INV2-1 and INV2-2 in the de-emphasis circuit DE203 is different from that in the third embodiment, but is the same as in the third embodiment in terms of such a number that a total number of the inverters INV1 and INV2 through which a feedback loop passes is an odd number. Therefore, a function of the de-emphasis circuit DE203 is the same as that in the third embodiment.

An input node of the inverter INV2-2 is connected to the inverter INV2-1 and an output node thereof is connected to the drains of the transistors Tr4 and T15. An input node of the inverter INV2-1 is connected to the node N8 between the inverter INV1-1 and the inverter INV1-2, and an output node thereof is connected to the inverter INV2-2.

The differential amplification circuit 310 has a load circuit LD301 and an auxiliary circuit AS311 instead of the load circuit LD1 and the auxiliary circuit AS11 (refer to FIG. 1), and further has a voltage adjustment circuit VA301, a correction circuit CR301, a capacitive element C11, and a capacitive element C12.

The load circuit LD301 further includes a transistor Tr9 as a ninth transistor and a transistor Tr11 as an eleventh transistor with respect to the load circuit LD1 (refer to FIG. 1). The transistor Tr9 is connected in series to the transistor Tr8, and is diode-connected via the transistor Tr8. The transistor Tr11 is connected in series to the transistor Tr10 and is diode-connected via the transistor Tr10. Each of the transistor Tr9 and the transistor Tr11 may be configured with a PMOS transistor.

The transistor Tr9 has a gate connected to the gate of the transistor Tr10 and the drain of the transistor Tr8, a source connected to the power supply voltage VCCQ, and a drain connected to the source of the transistor Tr8. The transistor Tr9 has the gate connected to the drain of the transistor Tr9 via the transistor Tr8 and also connected to the bias line NN via the node N1 to form a current mirror circuit with the transistor Tr4.

The transistor Tr11 has a gate connected to the gate of the transistor Tr8 and the drain of the transistor Tr10, a source connected to the power supply voltage VCCQ, and a drain connected to the source of the transistor Tr10. The transistor Tr11 has the gate connected to the drain of the transistor Tr11 via the transistor Tr10 and also connected to the bias line NNB via the node N2 to form a current mirror circuit with the transistor Tr25.

The auxiliary circuit AS311 further includes a transistor Tr7 as a seventh transistor with respect to the auxiliary circuit AS11 (refer to FIG. 1). The transistor Tr6 and the transistor Tr7 are connected in series between the node N1 and the power supply voltage VCCQ and are connected in parallel to the transistors Tr8 and Tr9. The transistor Tr7 has a gate receiving the input signal VIN, a drain connected to the source of the transistor Tr6, and a source connected to the power supply voltage VCCQ.

That is, the transistor Tr9 is diode-connected thereto and is also diode-connected in parallel to the transistor Tr6. Consequently, a mirror ratio of a drain current of the transistor Tr4 to a drain current of the transistor Tr9 (a current flowing from the load circuit LD301 side into the node N1) can be changed according to a level of the input signal VIN received by the gate of the transistor Tr7. Thus, the amplification degree of the differential amplification circuit 310 can be increased.

The voltage adjustment circuit VA301 is connected to the node N6 and is configured to be able to adjust a voltage of the node N6. The voltage adjustment circuit VA301 has a control node connected to the bias line NN, an input node connected to the power supply voltage VCCQ, and an output node connected to the node N6. Consequently, the voltage adjustment circuit VA301 can adjust a voltage of the node N6 according to a signal level of the bias line NN. The node N6 is an intermediate node in the auxiliary circuit AS311 and is connected to the drain of the transistor Tr7 and the source of the transistor Tr6.

The voltage adjustment circuit VA301 has a transistor Tr24. The transistor Tr24 is connected in parallel to the source of the transistor Tr6 along with the transistor Tr7. The transistor Tr24 is diode-connected via the transistor Tr6. The transistor Tr24 has a gate connected to the bias line NN, a source connected to the power supply voltage VCCQ, and a drain connected to the node N6.

That is, the transistor Tr24 is diode-connected via the bias line NN and the transistor Tr6. Consequently, reducing of a signal amplitude of the bias line NN is indirectly performed via voltage adjustment for the intermediate node N6 of the auxiliary circuit AS311. Thus, the signal amplitude of the bias line NN can be reduced more gently than when a diode-connected transistor (diode load) is directly connected to the bias line NN.

The correction circuit CR301 is connected to the bias line NN on the non-inverting side and a bias line NNB on the inverting side in the differential amplification circuit 310, and shares the transmission circuit TR1 with the differential amplification circuit 310 to be configured with a differential amplifier. The correction circuit CR301 includes the transistor Tr4, a transistor Tr25, a transistor Tr26, and a transistor Tr27. The transistor Tr25 has a gate connected to the bias line NNB, a source connected to the power supply voltage VCCQ, and a drain connected to the transistor Tr26. The transistor Tr26 has a gate connected to a drain thereof and a gate of the transistor Tr27, and thus forms a current mirror circuit with the transistor Tr27. A source of the transistor Tr26 is connected to the power supply voltage. The transistor Tr27 has a source connected to the power supply voltage and a drain connected to the transistor Tr4.

In the correction circuit CR301, a noise component included in a signal transmitted from the bias line NN on the non-inverting side to the input node on the inverting side and a noise component included in a signal transmitted from the bias line NNB on the inverting side to the input node on the non-inverting side may have the same polarity and a similar amplitude. Consequently, the correction circuit CR301 obtains a difference between the signal of the bias line NN and the signal of the bias line NNB, and supplies a difference signal VO1 with the reduced noise component to the output circuit 330 and the control circuit 40.

One end of the capacitive element C11 is connected to the output node of the inverter INV3, and the other end thereof is connected to the gate of the transistor Tr4 of the transmission circuit TR1 via the bias line NN. A loop including the transmission circuit TR1, the inverter INV3, the capacitive element C11, the bias line NN, and the transmission circuit TR1 in this order configures a first feedback loop for performing feedback control on the differential amplification circuit 310. The first feedback loop is a loop in which a direct current (DC) is blocked by the capacitive element C11, that is, a DC-cut loop. Thus, the first feedback control may be selectively performed when a level of the difference signal VO10 transmitted from the transmission circuit TR1 changes. Consequently, a voltage level of the bias line NN can be caused to rapidly transition from the H level to the L level or the L level to the H level while preventing the influence of the bias line NN on the voltage amplitude.

One end of the capacitive element C12 is connected to the output node of the inverter INV3, and the other end thereof is connected to the gate of the transistor Tr27 of the correction circuit CR301. A loop including the transmission circuit TR1, the inverter INV3, the capacitive element C12, the transistor Tr27, and the transmission circuit TR1 in this order configures a second feedback loop for performing feedback control on the correction circuit CR301. The second feedback loop is a loop in which a DC is blocked by the capacitive element C12, that is, a DC-cut loop. Therefore, the second feedback control may be selectively performed when a level of the difference signal VO10 transmitted from the transmission circuit TR1 changes.

Consequently, a voltage level for reducing the noise component of the correction circuit CR301 can be caused to rapidly transition from the H level to the L level or the L level to the H level.

The differential amplification circuit 320 has a load circuit LD302 and an auxiliary circuit AS321 instead of the load circuit LD2 and the auxiliary circuit AS21 (refer to FIG. 1), and further has a voltage adjustment circuit VA302, a correction circuit CR302, a capacitive element C21, and a capacitive element C22.

The load circuit LD302 further includes a transistor Tr28 and a transistor Tr29 with respect to the load circuit LD2 (refer to FIG. 1). The transistor Tr28 is connected in series to the transistor Tr20, and is diode-connected via the transistor Tr20. The transistor Tr29 is connected in series to the transistor Tr21 and is diode-connected via the transistor Tr21. Each of the transistor Tr28 and the transistor Tr29 may be configured with an NMOS transistor.

The transistor Tr28 has a gate connected to the gate of the transistor Tr21 and the drain of the transistor Tr20, a source connected to the ground voltage, and a drain connected to the source of the transistor Tr20. The transistor Tr28 has a gate connected to the drain of the transistor Tr28 via the transistor Tr20 and also connected to the bias line NP via the node N3 to form a current mirror circuit with the transistor Tr15.

The transistor Tr29 has a gate connected to the gate of the transistor Tr20 and the drain of the transistor Tr21, a source connected to the ground voltage, and a drain connected to the source of the transistor Tr21. The transistor Tr29 has a gate connected to the drain of the transistor Tr29 via the transistor Tr21 and also connected to the bias line NPB via the node N4 to form a current mirror circuit with the transistor Tr31.

The auxiliary circuit AS321 further includes a transistor Tr22 with respect to the auxiliary circuit AS21 (refer to FIG. 1). The transistor Tr17 and the transistor Tr22 are connected in series between the node N3 and the ground voltage and are connected in parallel to the transistors Tr20 and Tr28. The transistor Tr22 has a gate receiving the input signal VIN, a drain connected to the source of the transistor Tr17, and a source connected to the ground voltage.

That is, the transistor Tr28 is diode-connected thereto and is also diode-connected in parallel to the transistor Tr17. Consequently, a mirror ratio of a drain current of the transistor Tr15 to a drain current of the transistor Tr28 (a current flowing from the node N3 to the load circuit LD302 side) can be changed according to a level of the input signal VIN received by the gate of the transistor Tr22. Thus, the amplification degree of the differential amplification circuit 320 can be increased.

The voltage adjustment circuit VA302 is connected to the node N7 and is configured to be able to adjust a voltage of the node N7. The voltage adjustment circuit VA302 has a control node connected to the bias line NP, an input node connected to the ground voltage, and an output node connected to the node N7. Consequently, the voltage adjustment circuit VA302 can adjust a voltage of the node N7 according to a signal level of the bias line NP. The node N7 is an intermediate node in the auxiliary circuit AS321, and is connected to the drain of the transistor Tr22 and the source of the transistor Tr17.

The voltage adjustment circuit VA302 has a transistor Tr30. The transistor Tr30 is connected in parallel to the source of the transistor Tr17 along with the transistor Tr22. The transistor Tr30 is diode-connected via the transistor Tr17. The transistor Tr30 has a gate connected to the bias line NP, a source connected to the ground voltage, and a drain connected to the node N7.

That is, the transistor Tr30 is diode-connected via the bias line NP and the transistor Tr17. Consequently, reduction of a signal amplitude of the bias line NP is indirectly performed via voltage adjustment for the intermediate node N7 of the auxiliary circuit AS321. Thus, the signal amplitude of the bias line NP can be reduced more gently than when a diode-connected transistor (diode load) is directly connected to the bias line NP.

The correction circuit CR302 is connected to the bias line NP on the non-inverting side and a bias line NPB on the inverting side in the differential amplification circuit 320, and shares the transmission circuit TR2 with the differential amplification circuit 320 to be configured with a differential amplifier. The correction circuit CR302 includes the transistor Tr15, a transistor Tr31, a transistor Tr32, and a transistor Tr33. The transistor Tr31 has a gate connected to the bias line NPB, a source connected to the ground voltage, and a drain connected to the transistor Tr32. The transistor Tr32 has a gate connected to a drain thereof and a gate of the transistor Tr33, and thus forms a current mirror circuit with the transistor Tr33. A source of the transistor Tr32 is connected to the power supply voltage. The transistor Tr33 has a source connected to the power supply voltage and a drain connected to the transistor Tr15.

In the correction circuit CR302, a noise component included in a signal transmitted from the bias line NP on the non-inverting side to the input node on the inverting side and a noise component included in a signal transmitted from the bias line NPB on the inverting side to the input node on the non-inverting side may have the same polarity and a similar amplitude. Consequently, the correction circuit CR302 obtains a difference between the signal of the bias line NP and the signal of the bias line NPB, and supplies a difference signal VO2 with the reduced noise component to the output circuit 330 and the control circuit 40.

One end of the capacitive element C21 is connected to the output node of the inverter INV3, and the other end thereof is connected to the gate of the transistor Tr15 of the transmission circuit TR2 via the bias line NP. A loop including the transmission circuit TR2, the inverter INV3, the capacitive element C21, the bias line NP, and the transmission circuit TR2 in this order configures a third feedback loop for performing feedback control on the differential amplification circuit 320. The third feedback loop is a loop in which a DC is blocked by the capacitive element C21, that is, a DC-cut loop. Therefore, the third feedback control may be selectively performed when a level of the difference signal VO20 transmitted from the transmission circuit TR2 changes. Consequently, a voltage level of the bias line NP can be caused to rapidly transition from the H level to the L level or the L level to the H level while preventing the influence of the bias line NP on the voltage amplitude.

One end of the capacitive element C22 is connected to the output node of the inverter INV3, and the other end thereof is connected to the gate of the transistor Tr33 of the correction circuit CR302. A loop including the transmission circuit TR2, the inverter INV3, the capacitive element C22, the transistor Tr33, and the transmission circuit TR2 in this order configures a fourth feedback loop for performing feedback control on the correction circuit CR302. The fourth feedback loop is a loop in which a DC is blocked by the capacitive element C22, that is, a DC-cut loop. Thus, the fourth feedback control may be selectively performed when a level of the difference signal VO20 transmitted from the transmission circuit TR2 changes. Consequently, a voltage level for reducing the noise component of the correction circuit CR302 can be caused to rapidly transition from the H level to the L level or the L level to the H level.

The output circuit 330 receives the signal HVO from the differential amplification circuit 310 and the differential amplification circuit 320. The output circuit 330 uses the power supply voltage VCCQ and a power supply voltage VDDC to generate and output an output signal OUT according to the signal HVO. A level of the power supply voltage VDDC is different from a level of the power supply voltage VCCQ and may be set to be lower than the level of the power supply voltage VCCQ, for example.

The output circuit 330 includes a processing circuit 331, a level shifter 332, and a processing circuit 333. The processing circuit 331 receives the signal HVO from the differential amplification circuit 310 and the differential amplification circuit 320 and supplies the signal HVO to the level shifter 332. The level shifter 332 shifts a level of the signal HVO and supplies the level-shifted signal HVO to the processing circuit 333. The processing circuit 333 generates and outputs the output signal OUT corresponding to the level-shifted signal HVO.

The processing circuit 331 has a plurality of inverters INV1-1 and INV1-2. The plurality of inverters INV1-1 and INV1-2 are the same as the plurality of inverters INV1-1 and INV1-2 of the first embodiment. The level shifter 332 has an inverter INV1-3 and inverters INV4-1 to INV4-3. A series connection of the inverter INV1-3 and the inverter INV4-1 and a series connection of the inverter INV4-2 and the inverter INV4-3 are connected in parallel between the processing circuit 331 and the processing circuit 333. The processing circuit 333 has a plurality of inverters INV4-4 and INV4-5. The inverters INV1-1 to INV1-3 operate by using the power supply voltage VCCQ, and the inverters INV4-1 to INV4-5 operate by using the power supply voltage VDDC.

As described above, in the fourth embodiment, in the semiconductor device 301, the pre-emphasis circuits PE1 and PE2 and the de-emphasis circuits DE101 and DE102 form waveforms of the internal signals of the differential amplification circuits 310 and 320 into an undershoot waveform and an overshoot waveform. The de-emphasis circuit DE203 forms a waveform of the signal HVO synthesized from the difference signals VO10 and VO20 of the differential amplification circuits 310 and 320 into an undershoot waveform and an overshoot waveform. Consequently, the transition of the signal level can be speeded up while reducing a time average amplitude, and an operation frequency of the semiconductor device 301 can be pulled up with high current efficiency. Consequently, it is possible to achieve both reduction in power consumption and a high speed.

Fifth Embodiment

Next, a semiconductor device to a fifth embodiment will be described. Hereinafter, a description will focus on differences from the first embodiment to the fourth embodiment.

In the fourth embodiment, a combination of the pre-emphasis circuit and the de-emphasis circuit is implemented by the single input/single output circuit, but, in the fifth embodiment, the combination is implemented by a single input/differential output circuit.

Specifically, a semiconductor device 401 receives an input signal VIN as a single input, and outputs output signals OUT and OUTB as differential outputs. The output signals OUT and OUTB form a differential pair with each other.

Figure 9:
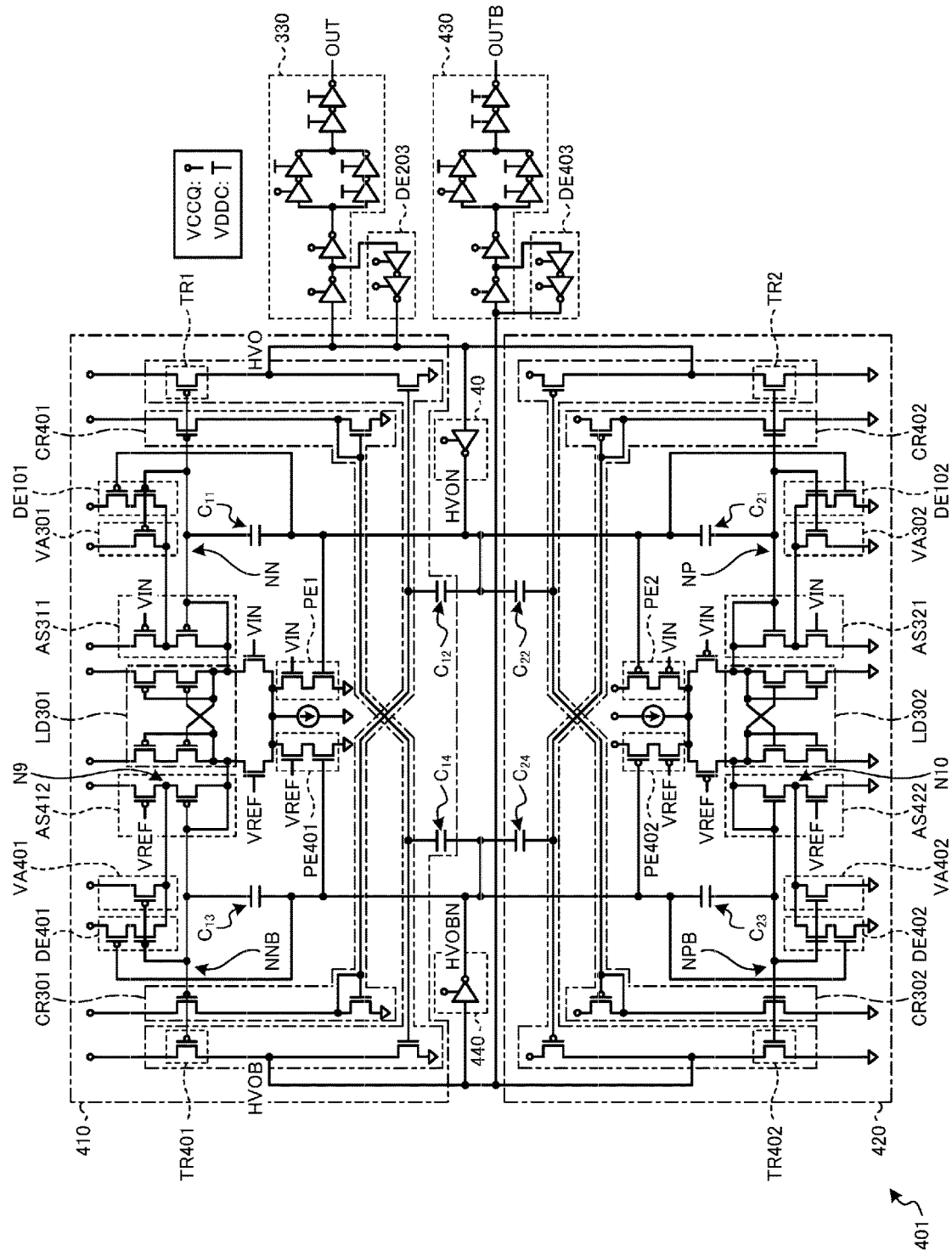
FIG. 9 is a circuit diagram showing a configuration of a semiconductor device according to a fifth embodiment.

The semiconductor device 401 may be configured as shown in FIG. 9. FIG. 9 is a diagram showing a configuration of the semiconductor device 401. The semiconductor device 401 has a differential amplification circuit 410 and a differential amplification circuit 420 instead of the differential amplification circuit 310 and the differential amplification circuit 320 (refer to FIG. 8), and further has an output circuit 430, a de-emphasis circuit DE403, and a control circuit 440.

The differential amplification circuit 410 includes an auxiliary circuit AS412 instead of the auxiliary circuit AS12 (refer to FIG. 8), and further includes a pre-emphasis circuit PE401, a de-emphasis circuit DE401, a transmission circuit TR401, a voltage adjustment circuit VA401, and a correction circuit CR401. The differential amplification circuit 420 has an auxiliary circuit AS422 instead of the auxiliary circuit AS22 (refer to FIG. 8), and further includes a pre-emphasis circuit PE402, a de-emphasis circuit DE402, a transmission circuit TR402, a voltage adjustment circuit VA402, and a correction circuit CR402.

The transmission circuit TR401 receives an internal signal via the bias line NNB, and generates and outputs a difference signal VOB10 according to the internal signal.

The transmission circuit TR402 receives an internal signal via the bias line NPB, and generates and outputs a difference signal VOB20 according to the internal signal.

The control circuit 440 receives the signal HVOB from the differential amplification circuit 410 and the differential amplification circuit 420. The control circuit 440 uses the power supply voltage VCCQ to generate a signal HVOBN corresponding to the signal HVOB and feed the signal HVOBN back to the pre-emphasis circuit PE401 and the de-emphasis circuit DE401 of the differential amplification circuit 410 and the pre-emphasis circuit PE402 and the de-emphasis circuit DE402 of the differential amplification circuit 20.

The pre-emphasis circuit PE401 is configured in the same manner as the pre-emphasis circuit PE1 except that the reference signal VREF is received instead of the input signal VIN. The pre-emphasis circuit PE401 forms a waveform of the internal signal of the differential amplification circuit 410 into an undershoot waveform by emphasizing an amplitude thereof at the time of level transition. Consequently, a slope of the signal HVOB at the time of level transition can be steepened.

The de-emphasis circuit DE401 is configured in the same manner as the de-emphasis circuit DE1 except that the signal HVOBN is received instead of signal HVON. The de-emphasis circuit DE401 forms a waveform of the internal signal of the differential amplification circuit 410 into an undershoot waveform by attenuating an amplitude thereof after level transition. Consequently, a slope of the signal HVOB at the time of level transition can be steepened.

The pre-emphasis circuit PE402 is configured in the same manner as the pre-emphasis circuit PE2 except that the reference signal VREF is received instead of the input signal VIN. The pre-emphasis circuit PE402 forms a waveform of the internal signal of the differential amplification circuit 420 into an overshoot waveform by emphasizing an amplitude thereof at the time of level transition. Consequently, a slope of the signal HVOB at the time of level transition can be steepened.

The de-emphasis circuit DE402 is configured in the same manner as the de-emphasis circuit DE2 except that the signal HVOBN is received instead of signal HVON. The de-emphasis circuit DE402 forms a waveform of the internal signal of the differential amplification circuit 420 into an overshoot waveform by attenuating an amplitude thereof after level transition. Consequently, a slope of the signal HVOB at the time of level transition can be steepened.

The auxiliary circuit AS412 is configured in the same manner as the auxiliary circuit AS311 except that the reference signal VREF is received instead of the input signal VIN, and a bias line NNB is connected instead of the bias line NN. The auxiliary circuit AS412 may change a mirror ratio of a current transferred from the load circuit LD301 to the transmission circuit TR401 via the bias line NNB according to a level of the reference signal VREF.

The auxiliary circuit AS422 is configured in the same manner as the auxiliary circuit AS321 except that the reference signal VREF is received instead of the input signal VIN, and a bias line NPB is connected instead of the bias lines NP. The auxiliary circuit AS422 may change a mirror ratio of a current transferred from the load circuit LD302 to the transmission circuit TR402 via the bias line NPB according to a level of the reference signal VREF.

The voltage adjustment circuit VA401 is connected to the node N9 and is configured to be able to adjust a voltage of the node N9. Consequently, the voltage adjustment circuit VA401 can gently reduce a signal amplitude of the bias line NNB.

The voltage adjustment circuit VA402 is connected to the node N10 and is configured to be able to adjust a voltage of the node N10. Consequently, the voltage adjustment circuit VA402 can gently reduce a signal amplitude of the bias line NNB.

The correction circuit CR401 is connected to the bias line NN on the non-inverting side and the bias line NNB on the inverting side in the differential amplification circuit 410, and shares the differential amplification circuit 410 and the transmission circuit TR401 to be configured with a differential amplifier. The correction circuit CR401 obtains a difference between the signal of the bias line NN and the signal of the bias line NNB, and supplies the difference signal VOB10 with the reduced noise component to the output circuit 430 and the control circuit 440.

The correction circuit CR402 is connected to the bias line NP on the non-inverting side and the bias line NPB on the inverting side in the differential amplification circuit 420, and shares the differential amplification circuit 420 and the transmission circuit TR402 to be configured with a differential amplifier. The correction circuit CR402 obtains a difference between the signal of the bias line NP and the signal of the bias line NPB, and supplies the difference signal VOB20 with the reduced noise component to the output circuit 430 and the control circuit 440.

The output circuit 430 is configured in the same manner as the output circuit 330 except that the input node thereof is connected to the transmission circuits TR401 and TR402 instead of the transmission circuits TR1 and TR2 (refer to FIG. 8). The output circuit 430 receives the signal HVOB from the differential amplification circuit 410 and the differential amplification circuit 420, and generates and outputs an output signal OUTB corresponding to the signal HVOB. The output signal OUTB and the output signal OUT form a differential pair.

As described above, in the fifth embodiment, in the semiconductor device 401, a combination of the pre-emphasis circuits PE1, PE401, PE2, and PE402, and the de-emphasis circuits DE101, DE401, DE102, DE402, DE203, and DE403 can be implemented by a single input/differential output circuit.

Sixth Embodiment

Next, a semiconductor device to a sixth embodiment will be described. Hereinafter, a description will focus on differences from the first embodiment to the fifth embodiment.

In the fourth embodiment, a combination of the pre-emphasis circuit and the de-emphasis circuit is implemented by the single input/single output circuit, but, in the sixth embodiment, the combination is implemented by a differential input/single output circuit.

Specifically, a semiconductor device 501 receives the input signals VIN and VINB as differential inputs and outputs the output signal OUT as a single output. The input signals VIN and VINB form a differential pair with each other.

Figure 10:
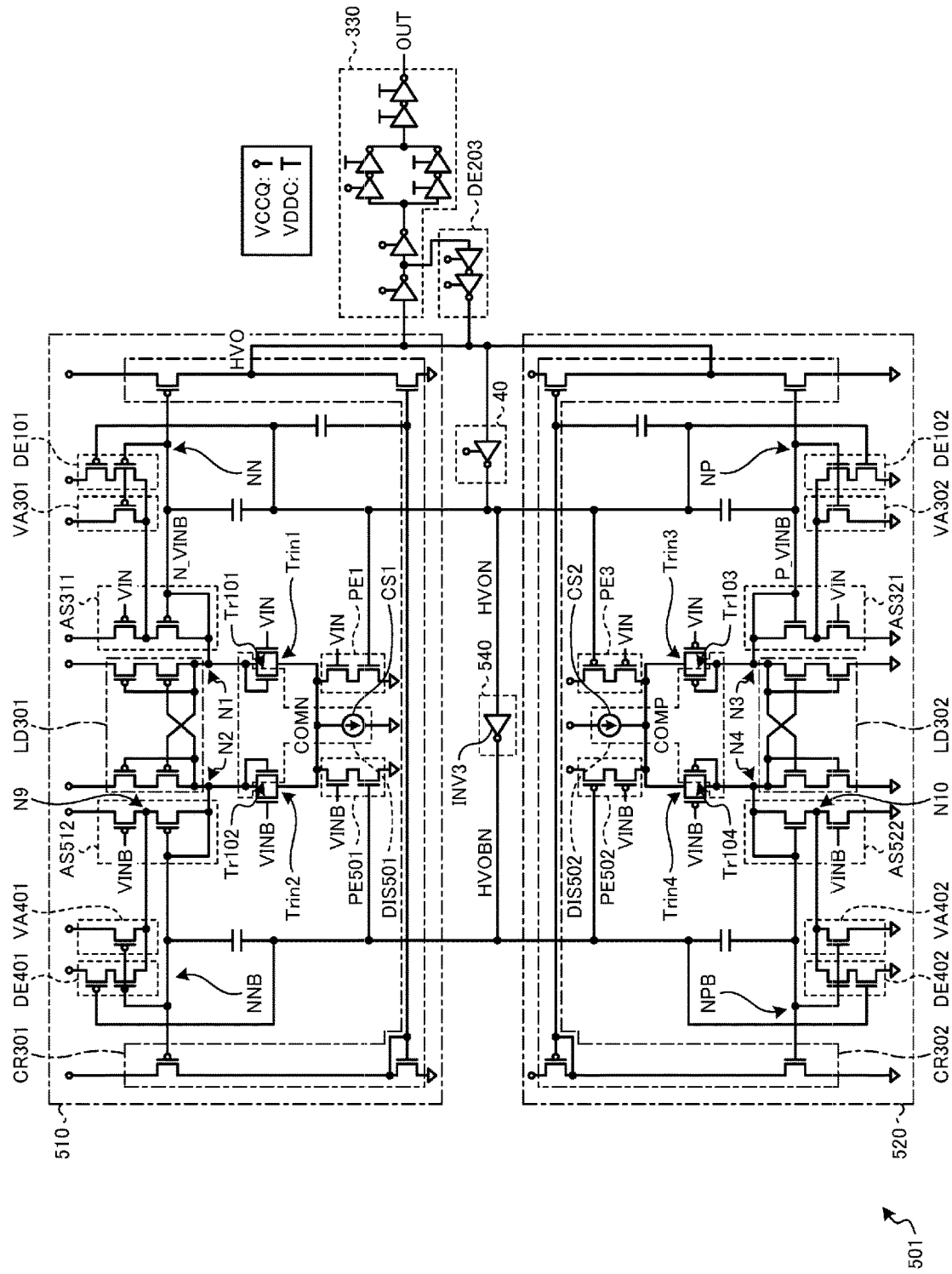
FIG. 10 is a circuit diagram showing a configuration of a semiconductor device according to a sixth embodiment.

The semiconductor device 501 may be configured as shown in FIG. 10. FIG. 10 is a diagram showing a configuration of the semiconductor device 501. The semiconductor device 501 has a differential amplification circuit 510 and a differential amplification circuit 520 instead of the differential amplification circuit 310 and the differential amplification circuit 320 (refer to FIG. 8), and further has a control circuit 540.

The differential amplification circuit 510 includes an auxiliary circuit AS512 instead of the auxiliary circuit AS12 (refer to FIG. 8), and further includes a pre-emphasis circuit PE501, a de-emphasis circuit DE401, a voltage adjustment circuit VA401, and a discharge circuit DIS501. The differential amplification circuit 520 includes an auxiliary circuit AS522 instead of the auxiliary circuit AS22 (refer to FIG. 8), and further includes a pre-emphasis circuit PE502, a de-emphasis circuit DE402, a voltage adjustment circuit VA402, and a discharge circuit DIS502.

The control circuit 540 is disposed between the control circuit 40, and the differential amplification circuit 510 and the differential amplification circuit 520. The control circuit 540 receives the signal HVON from the control circuit 40, generates a signal HVONB by logically inverting the signal HVON, and feeds the signal HVONB back to the pre-emphasis circuit PE501 and the de-emphasis circuit DE401 of the differential amplification circuit 510 and the pre-emphasis circuit PE502 and the de-emphasis circuit DE402 of the differential amplification circuit 520.

Pre-emphasis circuit PE501 is configured in the same manner as the pre-emphasis circuit PE1 except that the input signal VINB is received instead of the input signal VIN. The pre-emphasis circuit PE501 forms a waveform of the internal signal of the differential amplification circuit 510 into an undershoot waveform by emphasizing an amplitude thereof at the time of level transition. Consequently, a slope of the signal HVOB at the time of level transition can be steepened.

The de-emphasis circuit DE401 is configured in the same manner as the de-emphasis circuit DE1 except that the signal HVONB is received instead of signal HVON. The de-emphasis circuit DE401 forms a waveform of the internal signal of the differential amplification circuit 510 into an undershoot waveform by attenuating an amplitude thereof after level transition. Consequently, a slope of the signal HVOB at the time of level transition can be steepened.

The auxiliary circuit AS512 is configured in the same manner as the auxiliary circuit AS311 except that the input signal VINB is received instead of the input signal VIN, and a bias line NNB is connected instead of the bias line NN. The auxiliary circuit AS512 may change a mirror ratio of a current transferred from the load circuit LD301 to the correction circuit CR301 via the bias line NNB according to a level of the input signal VINB.

The voltage adjustment circuit VA401 is connected to the node N9 and is configured to be able to adjust a voltage of the node N9. Consequently, the voltage adjustment circuit VA401 can gently reduce a signal amplitude of the bias line NNB.

The discharge circuit DIS501 includes a transistor Tr101, a transistor Tr102, and a current source CS1. The transistor Tr101 and the transistor Tr102 configure a differential pair. Each of the transistor Tr101 and the transistor Tr102 may be configured with an NMOS transistor. The transistors Tr101 and Tr102 have drains electrically connected to gates thereof and the nodes N1 and N2, respectively, and sources electrically connected to one end of the current source CS1. The discharge circuit DIS501 releases electric charge of the nodes N1 and N2 according to voltages of the nodes N1 and N2 (for example, the voltages higher than a threshold voltage).

The pre-emphasis circuit PE502 is configured in the same manner as the pre-emphasis circuit PE2 except that the input signal VINB is received instead of the input signal VIN. The pre-emphasis circuit PE502 forms a waveform of the internal signal of the differential amplification circuit 520 into an overshoot waveform by emphasizing an amplitude thereof at the time of level transition. Consequently, a slope of the signal HVOB at the time of level transition can be steepened.

The de-emphasis circuit DE402 is configured in the same manner as the de-emphasis circuit DE2 except that the signal HVONB is received instead of signal HVON. The de-emphasis circuit DE402 forms a waveform of the internal signal of the differential amplification circuit 520 into an overshoot waveform by attenuating an amplitude thereof after level transition. Consequently, a slope of the signal HVOB at the time of level transition can be steepened.

The auxiliary circuit AS522 is configured in the same manner as the auxiliary circuit AS321 except that the input signal VINB is received instead of the input signal VIN, and a bias line NPB is connected instead of the bias line NP. The auxiliary circuit AS522 may change a mirror ratio of a current transferred from the load circuit LD302 to the correction circuit CR302 via the bias line NPB according to a level of the input signal VINB.

The voltage adjustment circuit VA402 is connected to the node N10 and is configured to be able to adjust a voltage of the node N10. Consequently, the voltage adjustment circuit VA402 can gently reduce a signal amplitude of the bias line NNB.

The discharge circuit DIS502 includes a transistor Tr103, a transistor Tr104, and a current source CS2. The transistor Tr103 and the transistor Tr104 configure a differential pair. Each of the transistor Tr103 and the transistor Tr104 may be configured with a PMOS transistor. The transistors Tr103 and Tr104 have drains electrically connected to gates thereof and the nodes N3 and N4, respectively, and sources electrically connected to one end of the current source CS2. The discharge circuit DIS502 releases electric charge of the nodes N3 and N4 according to voltages of the nodes N3 and N4 (for example, the voltages higher than a threshold voltage).

As described above, in the sixth embodiment, in the semiconductor device 501, a combination of the pre-emphasis circuits PE1, PE501, PE2, and PE502, and the de-emphasis circuits DE101, DE401, DE102, DE402, and DE203 can be implemented by a differential input/single output circuit.

Seventh Embodiment

Next, a semiconductor device to a seventh embodiment will be described. Hereinafter, a description will focus on differences from the first embodiment to the sixth embodiment.

In the fourth embodiment, a combination of the pre-emphasis circuit and the de-emphasis circuit is implemented by a single input/single output circuit, but, in the seventh embodiment, the combination is implemented by a differential input/differential output circuit.

Specifically, a semiconductor device 601 receives the input signals VIN and VINB as differential inputs and outputs the output signals OUT and OUTB as differential outputs. The input signals VIN and VINB form a differential pair with each other. The output signals OUT and OUTB form a differential pair with each other.

Figure 11:
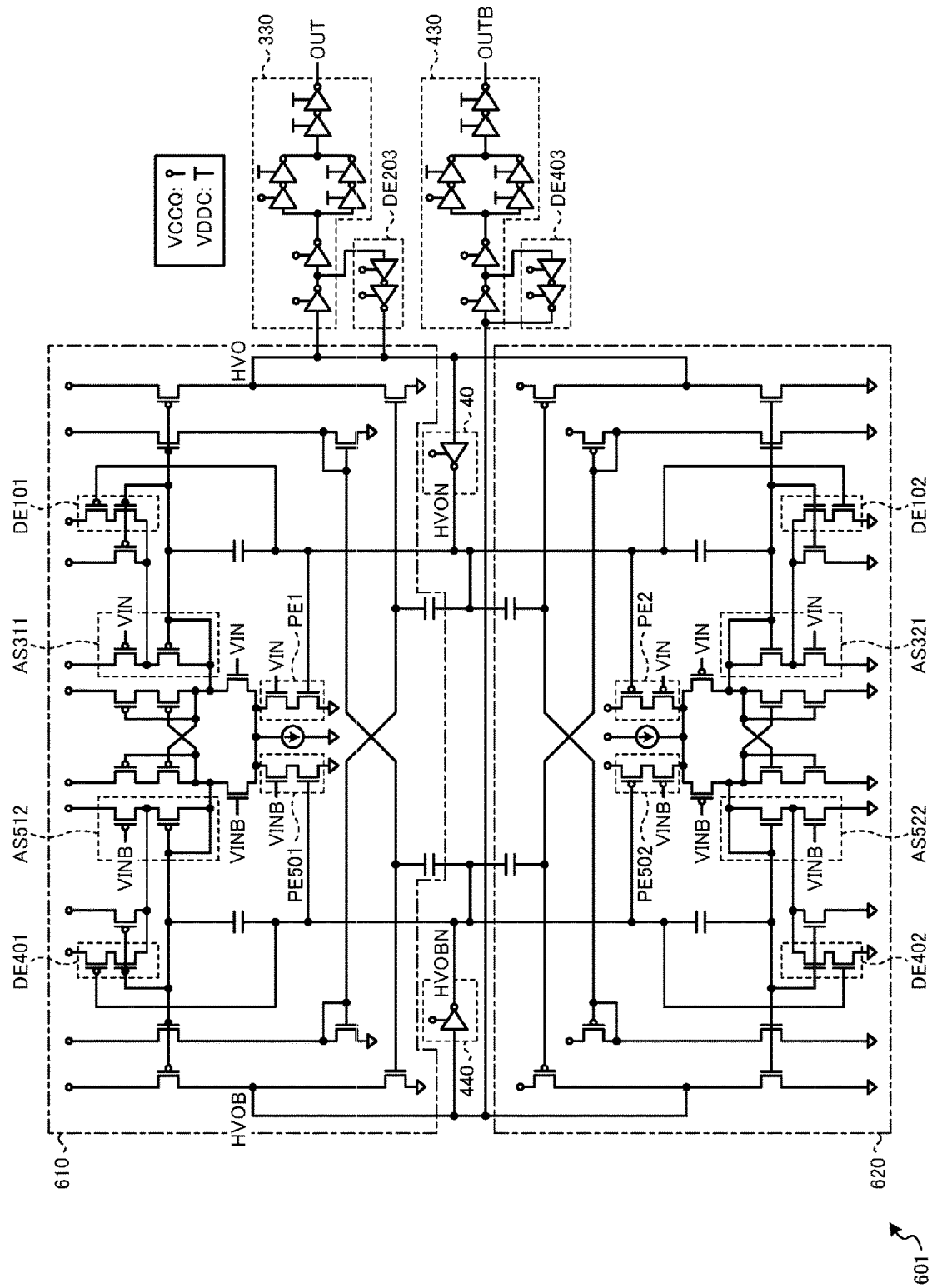
FIG. 11 is a circuit diagram showing a configuration of a semiconductor device according to a seventh embodiment.

The semiconductor device 601 may be configured as shown in FIG. 11. FIG. 11 is a diagram showing a configuration of the semiconductor device 601. The semiconductor device 601 has a differential amplification circuit 610 and a differential amplification circuit 620 instead of the differential amplification circuit 410 and the differential amplification circuit 420 (refer to FIG. 9).

The differential amplification circuit 610 includes a pre-emphasis circuit PE501 and an auxiliary circuit AS512 instead of the pre-emphasis circuit PE401 and the auxiliary circuit AS412 (refer to FIG. 9).

Pre-emphasis circuit PE501 is configured in the same manner as the pre-emphasis circuit PE1 except that the input signal VINB is received instead of the input signal VIN. The pre-emphasis circuit PE501 forms a waveform of the internal signal of the differential amplification circuit 510 into an undershoot waveform by emphasizing an amplitude thereof at the time of level transition. Consequently, a slope of the signal HVOB at the time of level transition can be steepened.

The auxiliary circuit AS512 is configured in the same manner as the auxiliary circuit AS311 except that the input signal VINB is received instead of the input signal VIN, and a bias line NNB is connected instead of the bias line NN. The auxiliary circuit AS512 may change a mirror ratio of a current transferred from the load circuit LD301 to the correction circuit CR301 via the bias line NNB according to a level of the input signal VINB.

The differential amplification circuit 620 includes a pre-emphasis circuit PE502 and an auxiliary circuit AS522 instead of the pre-emphasis circuit PE402 and the auxiliary circuit AS422 (refer to FIG. 9).

The pre-emphasis circuit PE502 is configured in the same manner as the pre-emphasis circuit PE2 except that the input signal VINB is received instead of the input signal VIN. The pre-emphasis circuit PE502 forms a waveform of the internal signal of the differential amplification circuit 520 into an overshoot waveform by emphasizing an amplitude thereof at the time of level transition. Consequently, a slope of the signal HVOB at the time of level transition can be steepened.

The auxiliary circuit AS522 is configured in the same manner as the auxiliary circuit AS321 except that the input signal VINB is received instead of the input signal VIN, and a bias line NPB is connected instead of the bias line NP. The auxiliary circuit AS522 may change a mirror ratio of a current transferred from the load circuit LD302 to the correction circuit CR302 via the bias line NPB according to a level of the input signal VINB.

As described above, in the seventh embodiment, in the semiconductor device 601, the combination of the pre-emphasis circuits PE1, PE501, PE2, and PE502, and the de-emphasis circuits DE101, DE401, DE102, DE402, DE203, and DE403 can be implemented by a differential input/differential output circuit.

Eighth Embodiment

Next, a semiconductor device to an eighth embodiment will be described. Hereinafter, a description will focus on differences from the first embodiment to the seventh embodiment.

In the fourth embodiment, a combination of the pre-emphasis circuit and the de-emphasis circuit is implemented by a single input/single output circuit using two differential amplification circuits having inverted polarities, but, in the eighth embodiment, the combination is implemented by a single input/single output circuit using one differential amplification circuit (N-type transistor reception).

Figure 12:
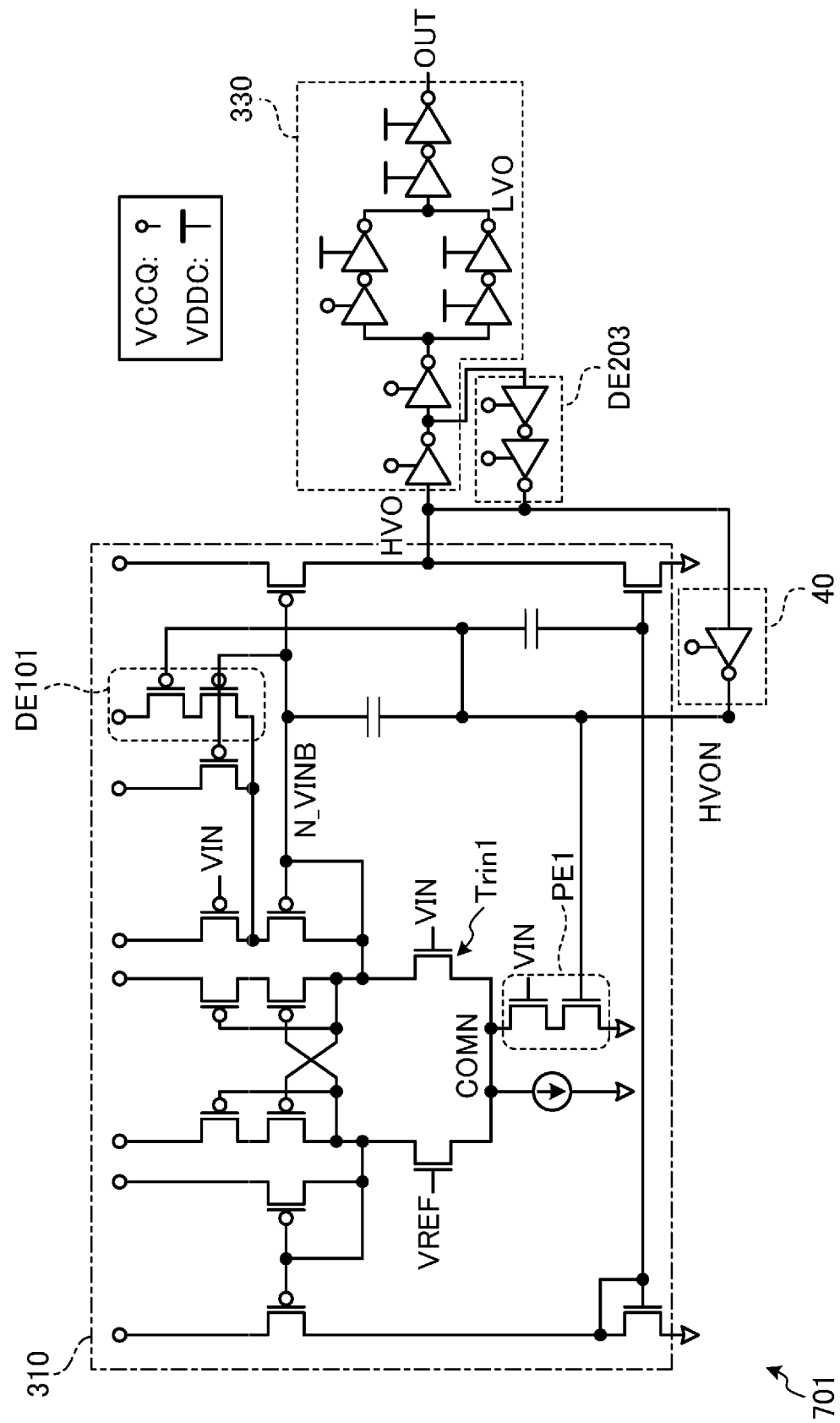
FIG. 12 is a circuit diagram showing a configuration of a semiconductor device according to an eighth embodiment.

Specifically, a semiconductor device 701 may be configured as shown in FIG. 12. FIG. 12 is a diagram showing a configuration of the semiconductor device 701. The semiconductor device 701 is configured by omitting the differential amplification circuit 320 from the semiconductor device 301 (refer to FIG. 8). The differential amplification circuit 310 receives the input signal VIN with the N-type input transistor Trin1, and is thus a differential amplification circuit related to N-type transistor reception.

The eighth embodiment is the same as the fourth embodiment in that the pre-emphasis circuit PE1 and the de-emphasis circuit DE101 form a waveform of the internal signal of the differential amplification circuit 310 into an undershoot waveform, and the de-emphasis circuit DE203 forms a waveform of the signal HVO into an undershoot waveform and an overshoot waveform.

As described above, in the eighth embodiment, in the semiconductor device 701, the combination of the pre-emphasis circuit PE1 and the de-emphasis circuits DE101 and DE203 is implemented by a single input/single output circuit using the differential amplification circuit related to N-type transistor reception.

Ninth Embodiment

Next, a semiconductor device to a ninth embodiment will be described. Hereinafter, a description will focus on differences from the first embodiment to the eighth embodiment.

In the fourth embodiment, a combination of the pre-emphasis circuit and the de-emphasis circuit is implemented by a single input/single output circuit using two differential amplification circuits having inverted polarities, but, in the ninth embodiment, the combination is implemented by a single input/single output circuit using one differential amplification circuit (P-type transistor reception).

Figure 13:
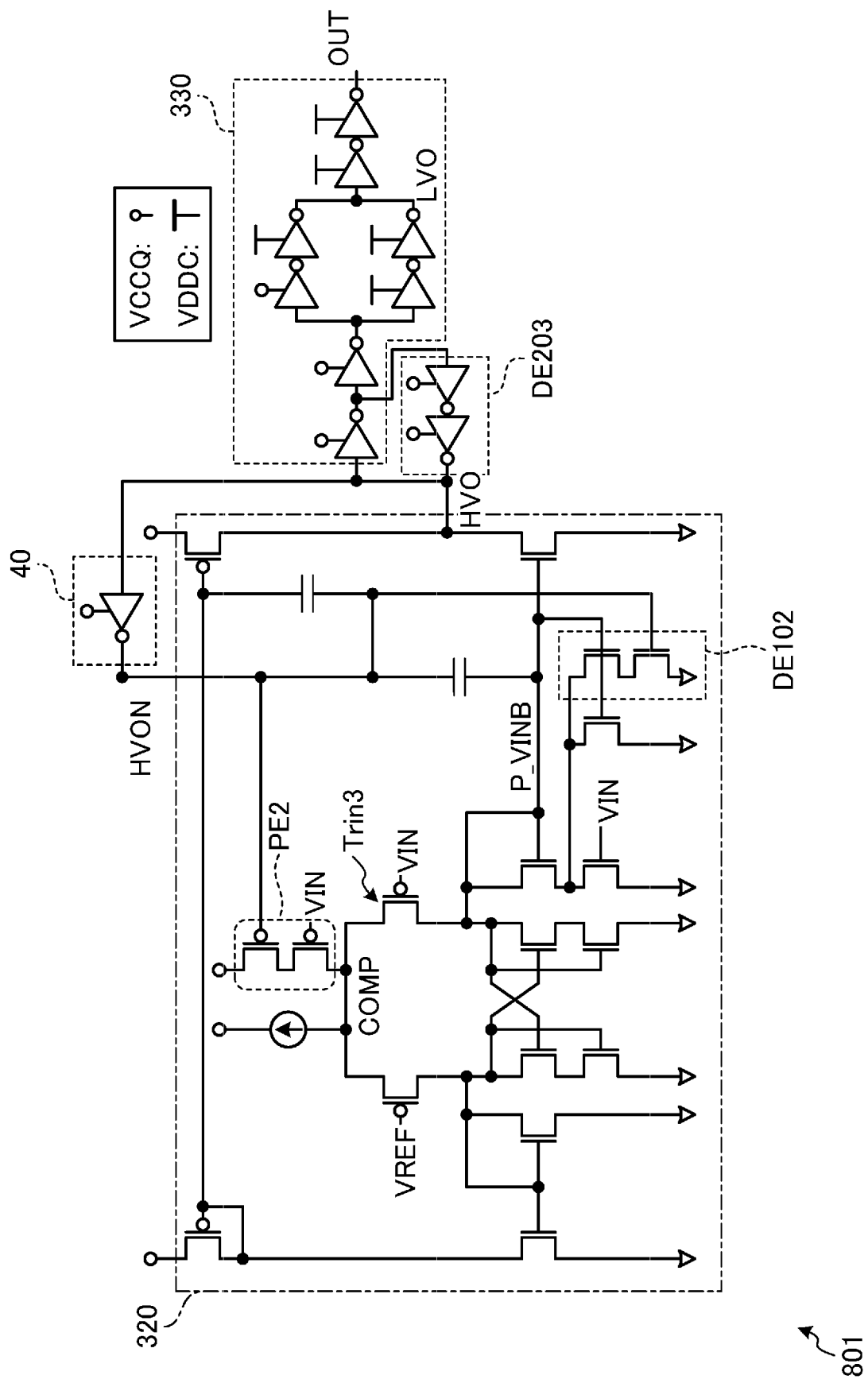
FIG. 13 is a circuit diagram showing a configuration of a semiconductor device according to a ninth embodiment.

Specifically, a semiconductor device 801 may be configured as shown in FIG. 13. FIG. 13 is a diagram showing a configuration of the semiconductor device 801. The semiconductor device 801 is configured by omitting the differential amplification circuit 310 from the semiconductor device 301 (refer to FIG. 8). The differential amplification circuit 320 receives the input signal VIN with the P-type input transistor Trin3, and is thus a differential amplification circuit related to P-type transistor reception.

The ninth embodiment is the fourth embodiment in that the pre-emphasis circuit PE2 and the de-emphasis circuit DE102 form a waveform of the internal signal of the differential amplification circuit 320 into an undershoot waveform, and the de-emphasis circuit DE203 forms a waveform of the signal HVO into an undershoot waveform and an overshoot waveform.

As described above, in the ninth embodiment, in the semiconductor device 801, the combination of the pre-emphasis circuit PE2 and the de-emphasis circuits DE102 and DE203 can be implemented by a single input/single output circuit using a differential amplification circuit related to P-type transistor reception.

Tenth Embodiment

Next, a semiconductor device to a tenth embodiment will be described. Hereinafter, a description will focus on differences from the first embodiment to the ninth embodiment.

In the fifth embodiment, a combination of the pre-emphasis circuit and the de-emphasis circuit is implemented by a single input/differential output circuit using two differential amplification circuits having inverted polarities, but, in the tenth embodiment, the combination is implemented by a single input/differential output circuit using one differential amplification circuit (N-type transistor reception).

Figure 14:
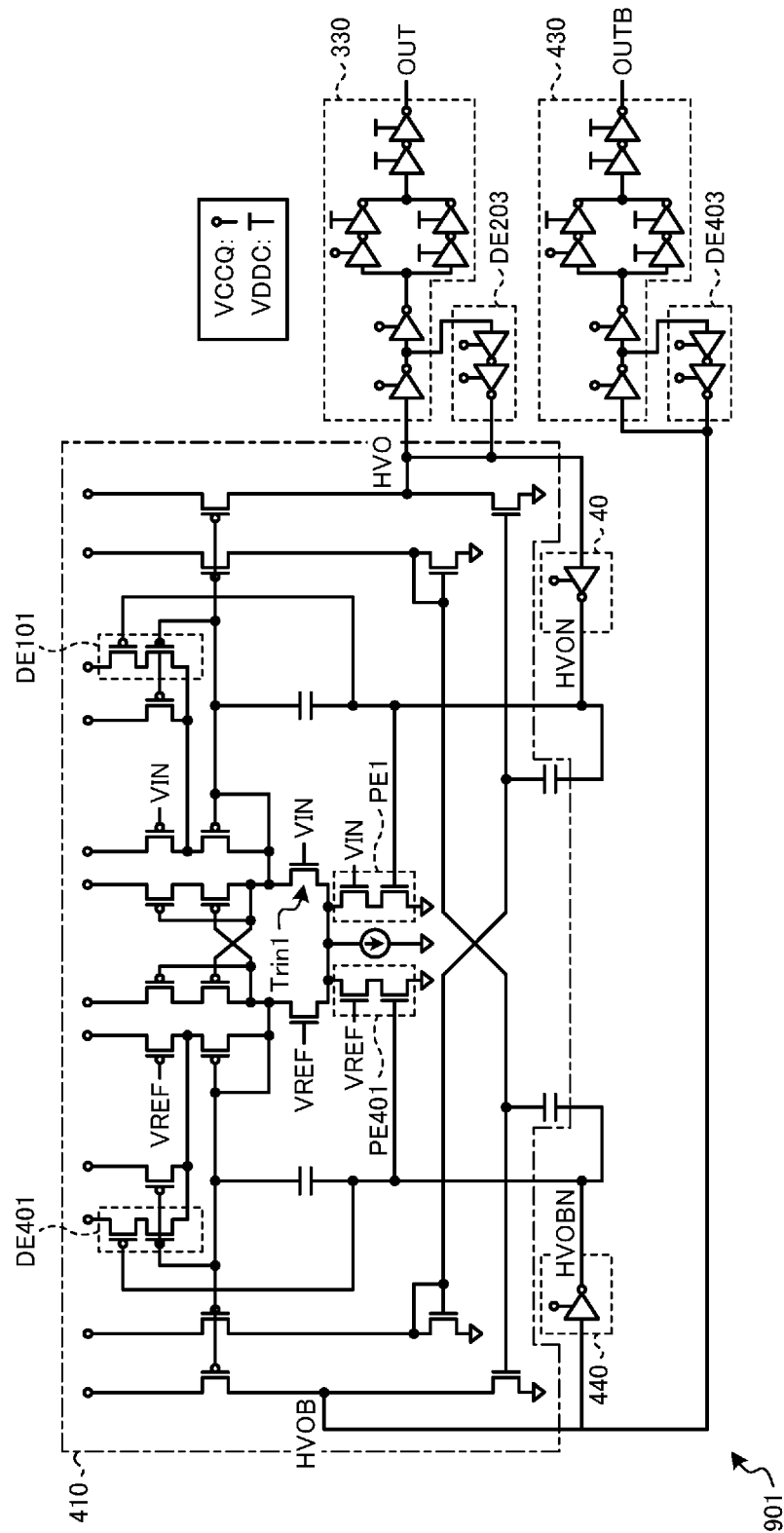
FIG. 14 is a circuit diagram showing a configuration of a semiconductor device according to a tenth embodiment.

Specifically, a semiconductor device 901 may be configured as shown in FIG. 14. FIG. 14 is a diagram showing a configuration of the semiconductor device 901. The semiconductor device 901 is configured by omitting the differential amplification circuit 420 from the semiconductor device 401 (refer to FIG. 9). The differential amplification circuit 410 receives the input signal VIN with the N-type input transistor Trin1, and is thus a differential amplification circuit related to N-type transistor reception.

The tenth embodiment is the same as the fifth embodiment in that the pre-emphasis circuits PE1 and PE401 and the de-emphasis circuits DE101 and DE401 form a waveform of the internal signal of the differential amplification circuit 310 into an undershoot waveform, and the de-emphasis circuits DE203 and DE403 form a waveform of the signal HVO into an undershoot waveform and an overshoot waveform.

As described above, in the tenth embodiment, in the semiconductor device 901, the combination of the pre-emphasis circuits PE1 and PE401 and the de-emphasis circuits DE101, DE401, DE203, and DE403 can be implemented by a single input/differential output circuit using a differential amplification circuit related to N-type transistor reception.

Eleventh Embodiment

Next, a semiconductor device to an eleventh embodiment will be described. Hereinafter, a description will focus on differences from the first embodiment to the tenth embodiment.

In the fifth embodiment, a combination of the pre-emphasis circuit and the de-emphasis circuit is implemented by a single input/differential output circuit using two differential amplification circuits having inverted polarities, but, in the eleventh embodiment, the combination is implemented by a single input/differential output circuit using one differential amplification circuit (P-type transistor reception).

Figure 15:
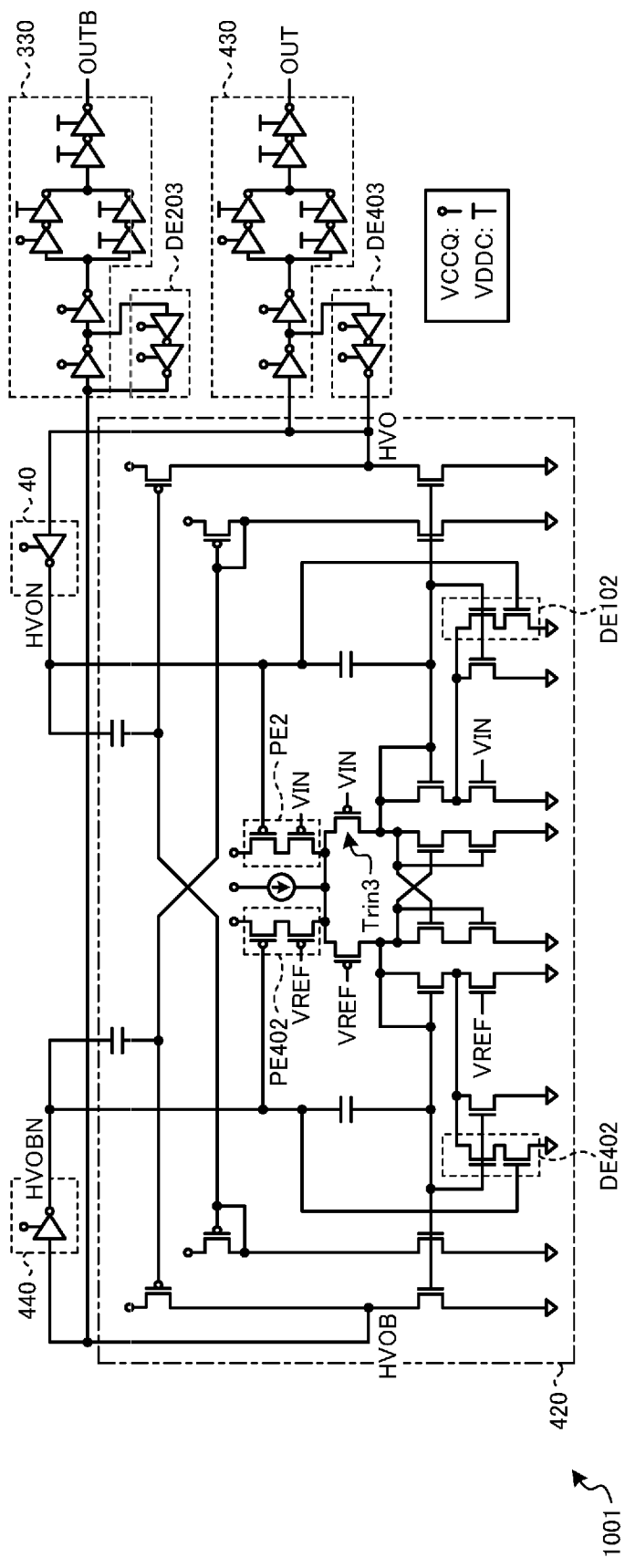
FIG. 15 is a circuit diagram showing a configuration of a semiconductor device according to an eleventh embodiment.

Specifically, a semiconductor device 1001 may be configured as shown in FIG. 15. FIG. 15 is a diagram showing a configuration of the semiconductor device 1001. The semiconductor device 1001 is configured by omitting the differential amplification circuit 410 from the semiconductor device 401 (refer to FIG. 9). The differential amplification circuit 420 receives the input signal VIN with the P-type input transistor Trin3, and is thus a differential amplification circuit related to P-type transistor reception.

The eleventh embodiment is the same as the fifth embodiment in that the pre-emphasis circuits PE2 and PE402 and the de-emphasis circuits DE102 and DE402 form a waveform of the internal signal of the differential amplification circuit 420 into an undershoot waveform, and the de-emphasis circuits DE203 and DE403 form a waveform of the signal HVO into an undershoot waveform and an overshoot waveform.

As described above, in the eleventh embodiment, in the semiconductor device 1001, the combination of the pre-emphasis circuits PE2 and PE402 and the de-emphasis circuits DE102, DE402, DE203, and DE403 can be implemented by a single input/differential output circuit using a differential amplification circuit related to P-type transistor reception.

Twelfth Embodiment

Next, a semiconductor device to a twelfth embodiment will be described. Hereinafter, a description will focus on differences from the first embodiment to the eleventh embodiment.

In the sixth embodiment, a combination of the pre-emphasis circuit and the de-emphasis circuit is implemented by a differential input/single output circuit using two differential amplification circuits having inverted polarities, but, in the twelfth embodiment, the combination is implemented by a differential input/single output circuit using one differential amplification circuit (N-type transistor reception).

Figure 16:
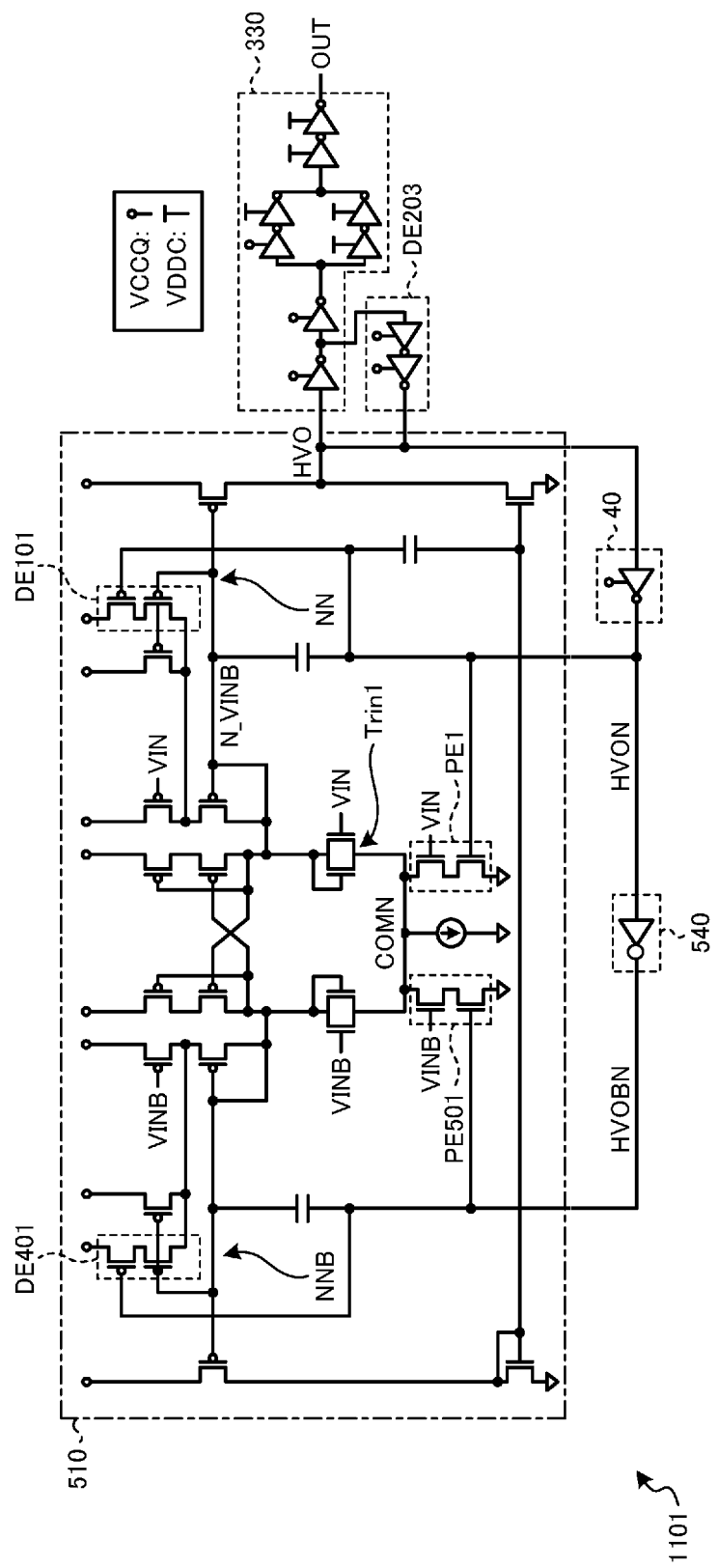
FIG. 16 is a circuit diagram showing a configuration of a semiconductor device according to a twelfth embodiment.

Specifically, a semiconductor device 1101 may be configured as shown in FIG. 16. FIG. 16 is a diagram showing a configuration of the semiconductor device 1101. The semiconductor device 1101 is configured by omitting the differential amplification circuit 520 from the semiconductor device 501 (refer to FIG. 10). The differential amplification circuit 510 receives the input signal VIN with the N-type input transistor Trin1, and is thus a differential amplification circuit related to N-type transistor reception.

The twelfth embodiment is the same as the sixth embodiment in that the pre-emphasis circuits PE1 and PE501 and the de-emphasis circuits DE101 and DE401 form a waveform of the internal signal of the differential amplification circuit 510 into an undershoot waveform, and the de-emphasis circuit DE203 transforms a waveform of the signal HVO into an undershoot waveform and an overshoot waveform.

As described above, in the twelfth embodiment, in the semiconductor device 1101, the combination of the pre-emphasis circuits PE1 and PE501 and the de-emphasis circuits DE101, DE401, and DE203 can be implemented by a differential input/single output circuit using a differential amplification circuit related to N-type transistor reception.

Thirteenth Embodiment

Next, a semiconductor device to a thirteenth embodiment will be described. Hereinafter, a description will focus on differences from the first embodiment to the twelfth embodiment.

In the sixth embodiment, a combination of the pre-emphasis circuit and the de-emphasis circuit is implemented by a differential input/single output circuit using two differential amplification circuits having inverted polarities, but, in the thirteenth embodiment, the combination is implemented by a differential input/single output circuit using one differential amplification circuit (P-type transistor reception).

Figure 17:
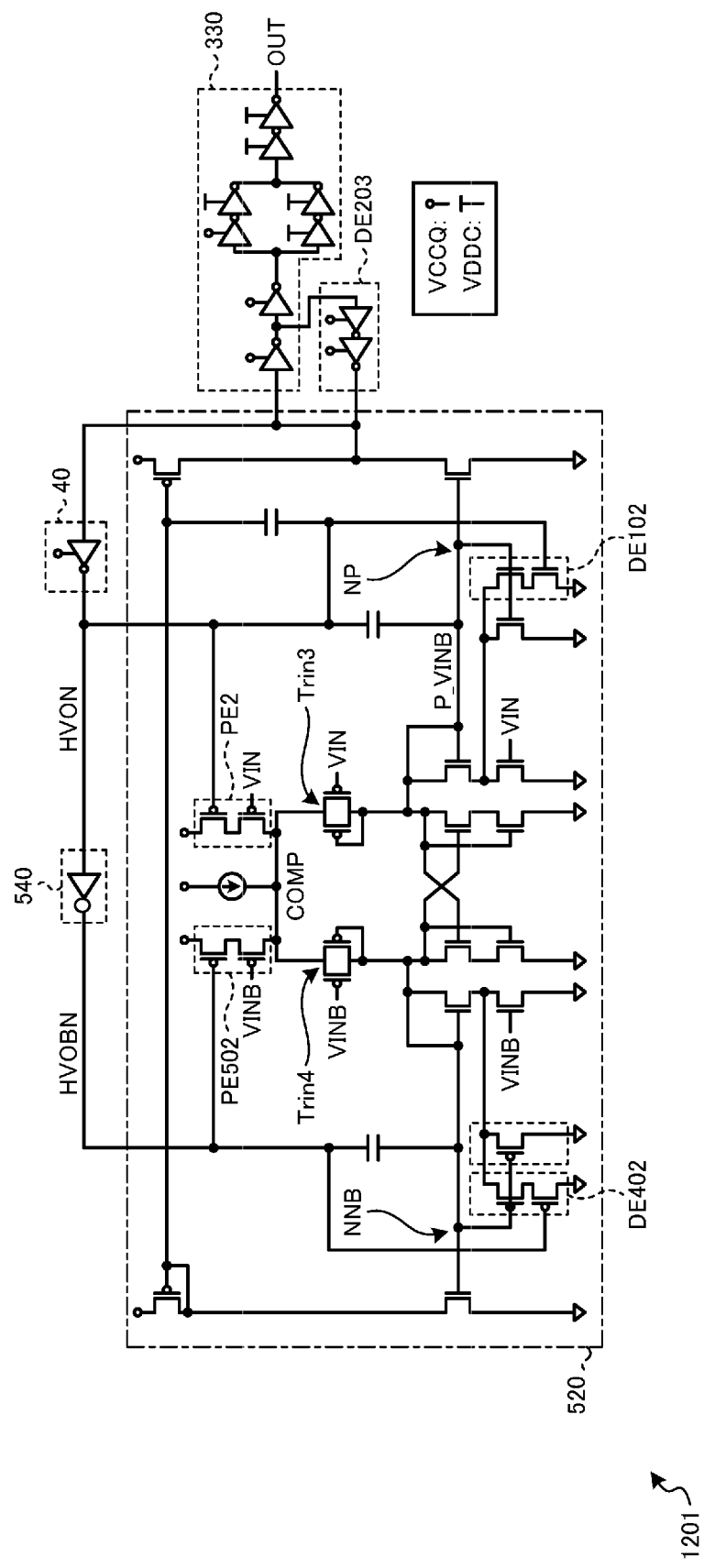
FIG. 17 is a circuit diagram showing a configuration of a semiconductor device according to a thirteenth embodiment.

Specifically, a semiconductor device 1201 may be configured as shown in FIG. 17. FIG. 17 is a diagram showing a configuration of the semiconductor device 1201. The semiconductor device 1201 is configured by omitting the differential amplification circuit 510 from the semiconductor device 501 (refer to FIG. 10). The differential amplification circuit 520 receives the input signal VIN with the P-type input transistor Trin3, and is thus a differential amplification circuit related to P-type transistor reception.

The thirteenth embodiment is the same as the sixth embodiment in that the pre-emphasis circuits PE2 and PE502 and the de-emphasis circuits DE102 and DE402 form a waveform of the internal signal of the differential amplification circuit 520 into an undershoot waveform, and the de-emphasis circuit DE203 forms a waveform of the signal HVO into an undershoot waveform and an overshoot waveform.

As described above, in the thirteenth embodiment, in the semiconductor device 1201, the combination of the pre-emphasis circuits PE2 and PE502 and the de-emphasis circuits DE102, DE402, and DE203 can be implemented by a differential input/single output circuit using a differential amplification circuit related to P-type transistor reception.

Fourteenth Embodiment

Next, a semiconductor device to a fourteenth embodiment will be described. Hereinafter, a description will focus on differences from the first embodiment to the thirteenth embodiment.

In the seventh embodiment, a combination of the pre-emphasis circuit and the de-emphasis circuit is implemented by a differential input/differential output circuit using two differential amplification circuits having inverted polarities, but, in the fourteenth embodiment, the combination is implemented by a differential input/differential output circuit using one differential amplification circuit (N-type transistor reception).

Figure 18:
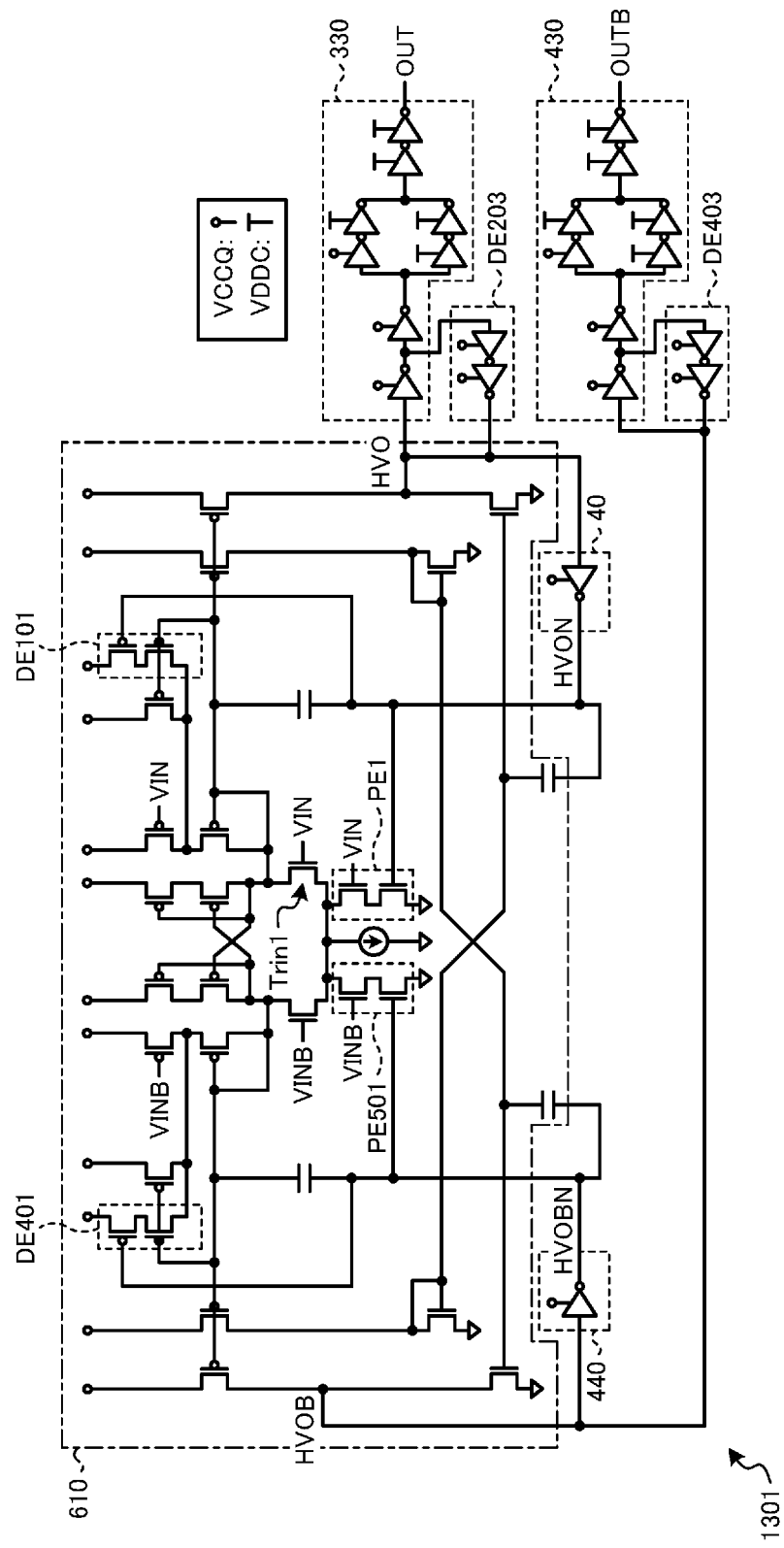
FIG. 18 is a circuit diagram showing a configuration of a semiconductor device according to a fourteenth embodiment.

Specifically, a semiconductor device 1301 may be configured as shown in FIG. 18. FIG. 18 is a diagram showing a configuration of the semiconductor device 1301. The semiconductor device 1301 is configured by omitting the differential amplification circuit 620 from the semiconductor device 601 (refer to FIG. 11). The differential amplification circuit 610 receives the input signal VIN with the N-type input transistor Trin1, and is thus a differential amplification circuit related to N-type transistor reception.

The fourteenth embodiment is the same as the seventh embodiment in that the pre-emphasis circuits PE1 and PE501 and the de-emphasis circuits DE101 and DE401 form a waveform of the internal signal of the differential amplification circuit 610 into an undershoot waveform, and the de-emphasis circuits DE203 and DE403 form a waveform of the signal HVO into an undershoot waveform and an overshoot waveform.

As described above, in the fourteenth embodiment, in the semiconductor device 1301, the combination of the pre-emphasis circuits PE1 and PE501 and the de-emphasis circuits DE101, DE401, DE203, and DE403 can be implemented by a differential input/differential output circuit using a differential amplification circuit related to N-type transistor reception.

Fifteenth Embodiment

Next, the semiconductor device to a fifteenth embodiment will be described. Hereinafter, a description will focus on differences from the first embodiment to the fourteenth embodiment.

In the seventh embodiment, a combination of the pre-emphasis circuit and the de-emphasis circuit is implemented by a differential input/differential output circuit using two differential amplification circuits having inverted polarities, but, in the fifteenth embodiment, the combination is implemented by a differential input/differential output circuit using one differential amplification circuit (P-type transistor reception).

Figure 19:
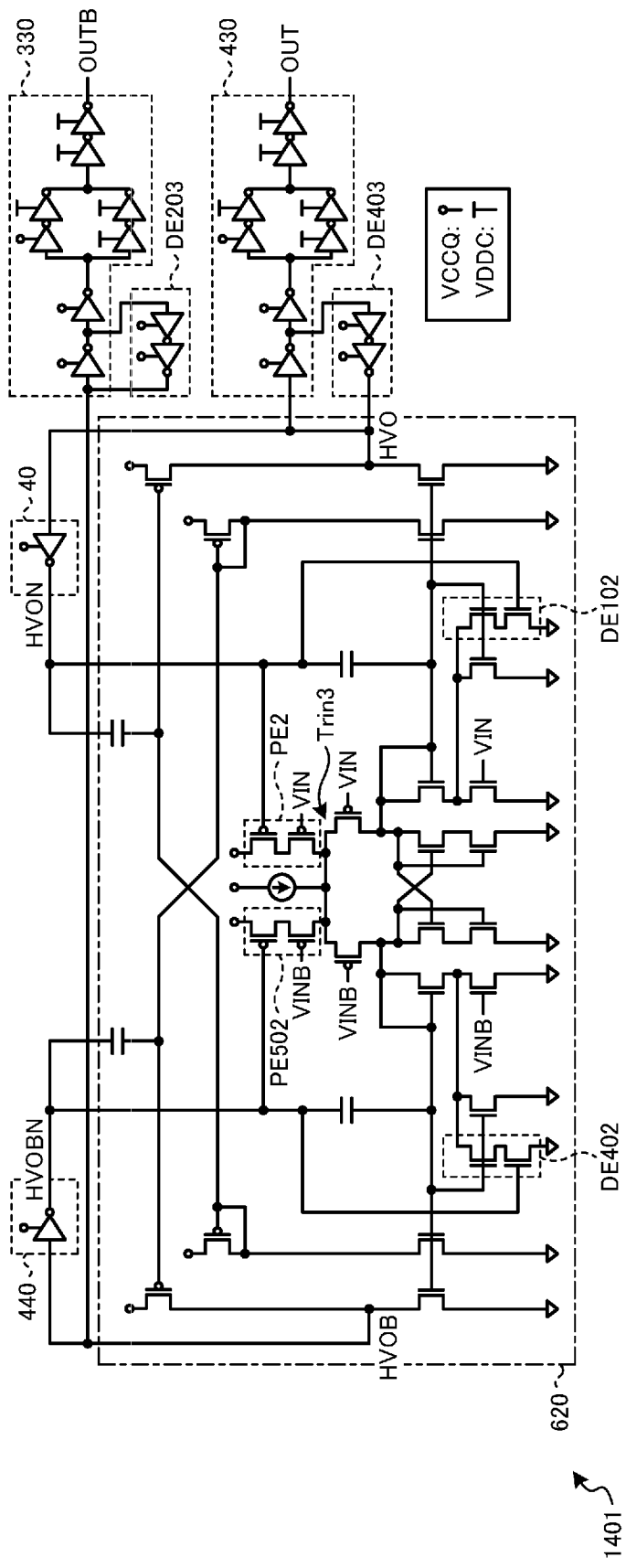
FIG. 19 is a circuit diagram showing a configuration of a semiconductor device according to a fifteenth embodiment.

Specifically, a semiconductor device 1401 may be configured as shown in FIG. 19. FIG. 19 is a diagram showing a configuration of the semiconductor device 1401. The semiconductor device 1401 is configured by omitting the differential amplification circuit 610 from the semiconductor device 601 (refer to FIG. 11). The differential amplification circuit 620 receives the input signal VIN with the P-type input transistor Trin3, and is thus a differential amplification circuit related to P-type transistor reception.

The fifteenth embodiment is the same as the seventh embodiment in that the pre-emphasis circuits PE2 and PE502 and the de-emphasis circuits DE102 and DE402 form a waveform of the internal signal of the differential amplification circuit 620 into an undershoot waveform, and the de-emphasis circuits DE203 and DE403 form a waveform of the signal HVO into an undershoot waveform and an overshoot waveform.

As described above, in the fifteenth embodiment, in the semiconductor device 1401, the combination of the pre-emphasis circuits PE2 and PE502 and the de-emphasis circuits DE102, DE402, DE203, and DE403 can be implemented by a differential input/differential output circuit using a differential amplification circuit related to P-type transistor reception.

Sixteenth Embodiment

Next, a semiconductor device to a sixteenth embodiment will be described. Hereinafter, a description will focus on differences from the first embodiment to the fifteenth embodiment.

In the third embodiment, an operation point of the de-emphasis circuit DE203 is not particularly limited. Consequently, levels of amplitude attenuation amounts $\Delta V_L$ and $\Delta V_H$ (refer to FIG. 7) after level transition of the signal HVO using the de-emphasis circuit DE203 may vary depending on the environmental conditions such as a power supply voltage or a temperature.

Therefore, in the sixteenth embodiment, by synchronizing the operation point of the de-emphasis circuit DE1503 with the differential amplification circuits 210 and 220, the de-emphasis circuit DE1503 is operated while preventing the influence of fluctuations due to environmental conditions, and levels of the attenuation amounts $\Delta V_L$ and $\Delta V_H$ are stabilized.

Figure 20:
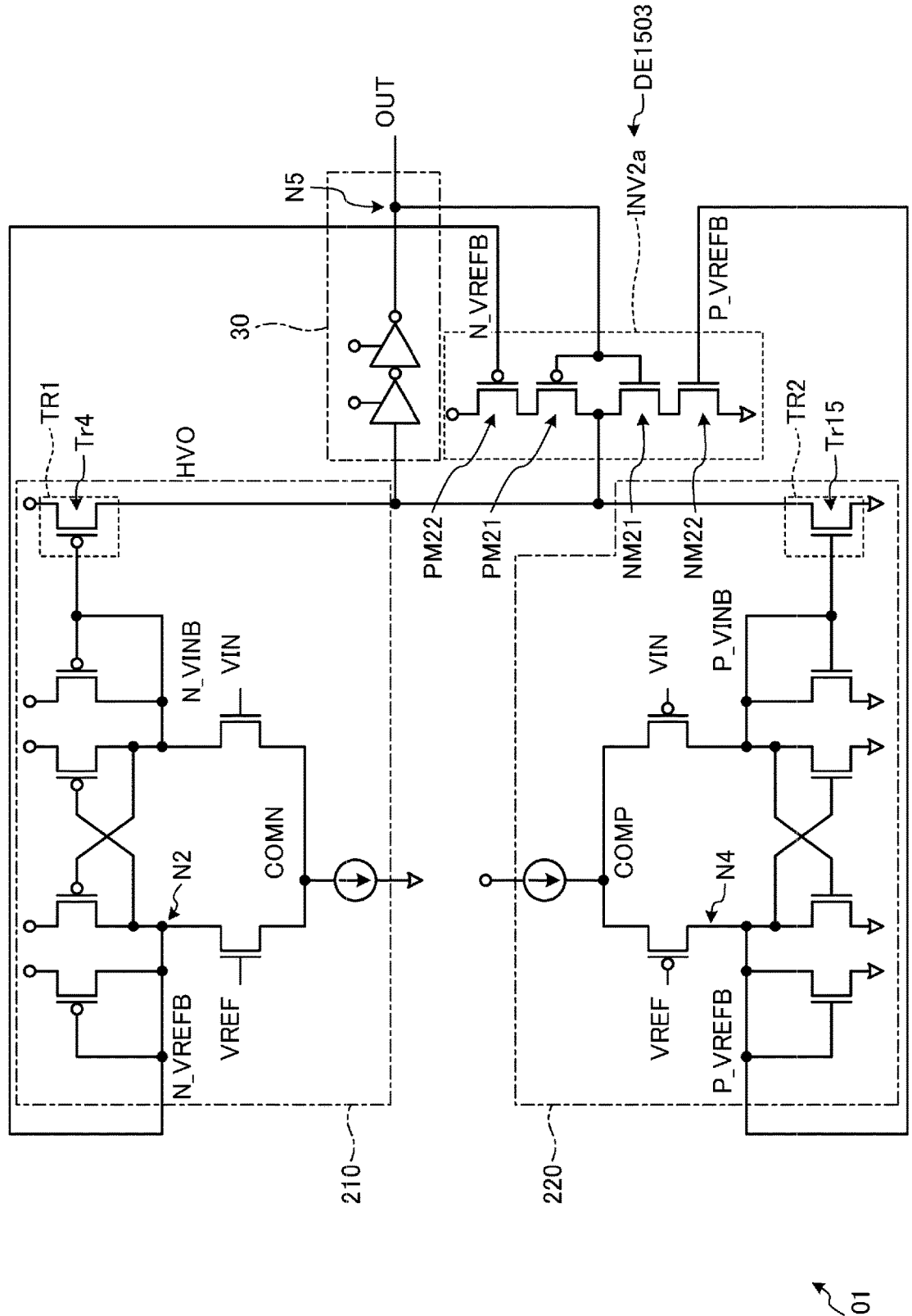
FIG. 20 is a circuit diagram showing a configuration of a semiconductor device according to a sixteenth embodiment.

Specifically, a semiconductor device 1501 may be configured as shown in FIG. 20. FIG. 20 is a diagram showing a configuration of the semiconductor device 1501. The semiconductor device 1501 has a de-emphasis circuit DE1503 instead of the de-emphasis circuit DE203 (refer to FIG. 5). The de-emphasis circuit DE1503 has an inverter INV2a instead of the inverter INV2 (refer to FIG. 5). The inverter INV2a has an input node connected to the node N5, an output node connected to the drains of the transistors Tr4 and Tr15, a first control node connected to the node N2 of the differential amplification circuit 210, and a second control node connected to the node N4 of the differential amplification circuit 220.

The inverter INV2a has a plurality of N-type transistors NM21 and NM22 and a plurality of P-type transistors PM21 and PM22. The transistor NM21 is connected between the transistor PM21 and the transistor NM22, and the transistor PM21 is connected between the transistor PM22 and the transistor NM21. The transistor NM22 is connected between the transistor NM21 and the ground voltage, and the transistor PM22 is connected between the power supply voltage VCCQ and the transistor PM21. The transistor NM21 and the transistor PM21 are connected to an inverter.

The transistor NM22 has a source connected to the ground voltage, a drain connected to the transistor NM21, and a gate connected to the node N4 of the differential amplification circuit 220. The transistor NM22 is turned on to activate the transistor NM21 and the transistor PM21 during a period in which an internal signal P_VREFB of the differential amplification circuit 220 has an active level (for example, an H level), and is turned off to deactivate the transistor NM21 and the transistor PM21 during a period in which the internal signal P_VREFB has an inactive level (for example, an L level).

The transistor PM22 has a source connected to the power supply voltage VCCQ, a drain connected to the transistor PM21, and a gate connected to the node N2 of the differential amplification circuit 210. The transistor PM22 is turned on to activate the transistor NM21 and the transistor PM21 during a period in which an internal signal N_VREFB of the differential amplification circuit 210 has an active level (for example, an L level), and is turned off to deactivate the transistor NM21 and the transistor PM21 during a period in which the internal signal N_VREFB of the differential amplification circuit 210 has an inactive level (for example, an H level).

An operation point of the inverter INV2a of the de-emphasis circuit DE1503 can be synchronized with the differential amplification circuits 210 and 220 through operations of the transistors NM22 and PM22.

For example, when the transistor Tr15 is strongly turned on according to the internal signal P_VINB, the transistor PM22 is strongly turned on according to the internal signal N_VREFB, and an H level amplitude of the signal HVO is attenuated by the attenuation amount $\Delta V_H$. When the transistor Tr4 is strongly turned on according to the internal signal N_VINB, the transistor NM22 is strongly turned on according to the internal signal P_VREFB, and an H level amplitude of the signal HVO is attenuated by the attenuation amount $\Delta V_L$.

Since the strength for turning on each of the transistor NM22 and PM22 is determined based on drive forces of the differential amplification circuits 210 and 220, levels of the amplitude attenuation amounts $\Delta V_L$ and $\Delta V_H$ after level transition of the signal HVO can be easily stabilized regardless of environmental conditions.

As described above, in the sixteenth embodiment, in the semiconductor device 1501, the operation point of the de-emphasis circuit DE1503 is synchronized with the differential amplification circuits 210 and 220. Consequently, the de-emphasis circuit DE1503 can be operated while preventing the influence of fluctuations due to environmental conditions, and thus the levels of the attenuation amounts $\Delta V_L$ and $\Delta V_H$ can be stabilized.

Seventeenth Embodiment

Next, a semiconductor device to a seventeenth embodiment will be described. Hereinafter, a description will focus on differences from the first embodiment to the sixteenth embodiment.

In the sixteenth embodiment, the transistors NM22 and PM22 of the de-emphasis circuit DE1503 are strongly turned on, but, in the seventeenth embodiment, high accuracy of levels of the attenuation amounts $\Delta V_L$ and $\Delta V_H$ is achieved by adjusting the strength for turning on the transistors NM22 and PM22.

Figure 21:
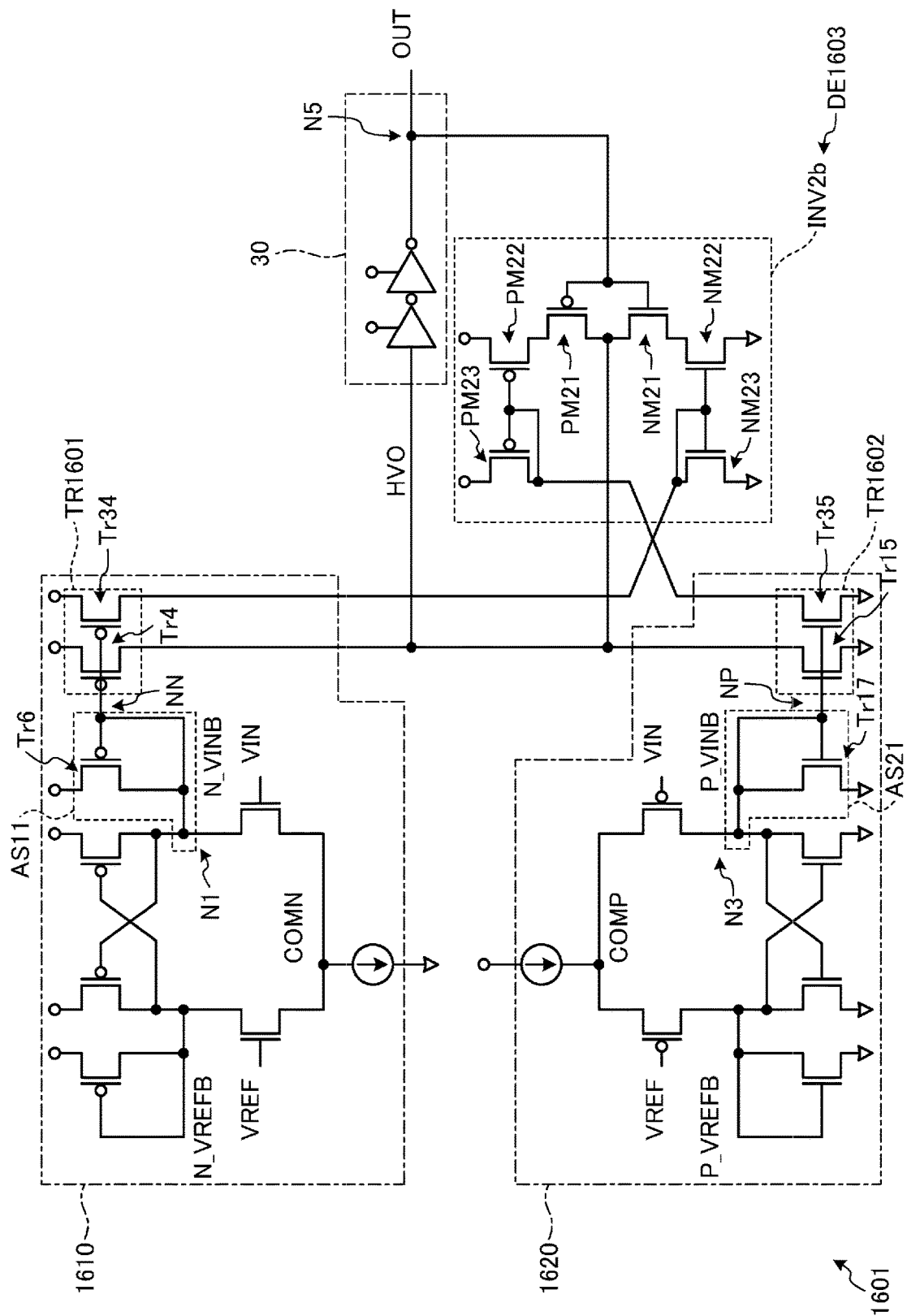
FIG. 21 is a circuit diagram showing a configuration of a semiconductor device according to a seventeenth embodiment.

Specifically, a semiconductor device 1601 may be configured as shown in FIG. 21. FIG. 21 is a diagram showing a configuration of the semiconductor device 1601. The semiconductor device 1601 includes a differential amplification circuit 1610, a differential amplification circuit 1620, and a de-emphasis circuit DE1603 instead of the differential amplification circuit 210, the differential amplification circuit 220, and the de-emphasis circuit DE1503 (refer to FIG. 20).

The differential amplification circuit 1610 has a transmission circuit TR1601 instead of the transmission circuit TR1. The transmission circuit TR1601 further includes a transistor Tr34. The transistor Tr34 may be configured with a PMOS transistor. The transistor Tr34 has a gate connected to the auxiliary circuit AS11 via the bias line NN. The transistor Tr34 also has a drain connected to the de-emphasis circuit DE1603 and a source connected to the power supply voltage VCCQ.

The differential amplification circuit 1620 has a transmission circuit TR1602 instead of the transmission circuit TR2. The transmission circuit TR1602 further includes a transistor Tr35. The transistor Tr35 may be configured with a PMOS transistor. The transistor Tr35 has a gate connected to the auxiliary circuit AS21 via the bias line NP. The transistor Tr35 also has a drain connected to the de-emphasis circuit DE1603 and a source connected to the ground voltage.

The de-emphasis circuit DE1603 has an inverter INV2b instead of the inverter INV2a (refer to FIG. 20). The inverter INV2b has an input node connected to the node N5, an output node connected to the drains of the transistor Tr4 and Tr15, a first control node connected to the drain of the transistor Tr35, and a second control node connected to the drain of the transistor Tr34.

The inverter INV2b has a plurality of N-type transistors NM21 to NM23 and a plurality of P-type transistors PM21 to PM23.

The transistor NM23 has a source connected to the ground voltage, a drain connected to the drain of the transistor Tr34, and a gate connected to the drain thereof and the gate of the transistor NM22. The transistor NM22 and the transistor NM23 configure a current mirror circuit.

The current mirror circuit supplies a current to which a drain current of the transistor Tr34 is copied according to a mirror ratio, to the drain side of the transistor NM21. That is, an amount of a current supplied to the gate of the transistor NM22 can be adjusted according to a drive force of the differential amplification circuit 1610 and a mirror ratio of the current mirror circuit, and thus the strength for turning on the transistor NM22 can be adjusted. The mirror ratio of the current mirror circuit may be adjusted by changing a ratio between a dimension of the transistor NM23 and a dimension of the transistor NM22.

The transistor PM23 has a source connected to the power supply voltage VCCQ, a drain connected to the drain of the transistor Tr35, and a gate connected to the drain thereof and the gate of the transistor PM22. The transistor PM22 and the transistor PM23 configure a current mirror circuit.

The current mirror circuit supplies a current to which a drain current of the transistor Tr35 is copied according to a mirror ratio, to the drain side of the transistor PM21. That is, an amount of a current supplied to the gate of the transistor PM22 can be adjusted according to a drive force of the differential amplification circuit 1620 and a mirror ratio of the current mirror circuit, and thus the strength for turning on the transistor PM22 can be adjusted. The mirror ratio of the current mirror circuit may be adjusted by changing a ratio between a dimension of the transistor PM23 and a dimension of the transistor PM22.

The seventeenth embodiment is the same as the sixteenth embodiment in that the operation point of the inverter INV2b of the de-emphasis circuit DE1603 can be synchronized with the differential amplification circuits 1610 and 1620 through operations of the transistors NM22 and PM22.

As described above, in the seventeenth embodiment, in the semiconductor device 1601, the strength for turning on the transistors NM22 and PM22 is adjusted according to the drive forces of the differential amplification circuits 1610 and 1620 and the mirror ratio of the current mirror circuit including the transistors NM22 and PM22. Consequently, high accuracy of the levels of the attenuation amounts $\Delta V_L$ and $\Delta V_H$ using the de-emphasis circuit DE1603 can be achieved.

Eighteenth Embodiment

Next, a semiconductor device to an eighteenth embodiment will be described. Hereinafter, a description will focus on differences from the first embodiment to the seventeenth embodiment.

In the seventeenth embodiment, an operation point of the de-emphasis circuit DE1603 is synchronized with the differential amplification circuits 1610 and 1620, but, in the eighteenth embodiment, the operation point of the de-emphasis circuit DE1703 is slightly delayed with respect to the differential amplification circuits 1610 and 1620.

Figure 22:
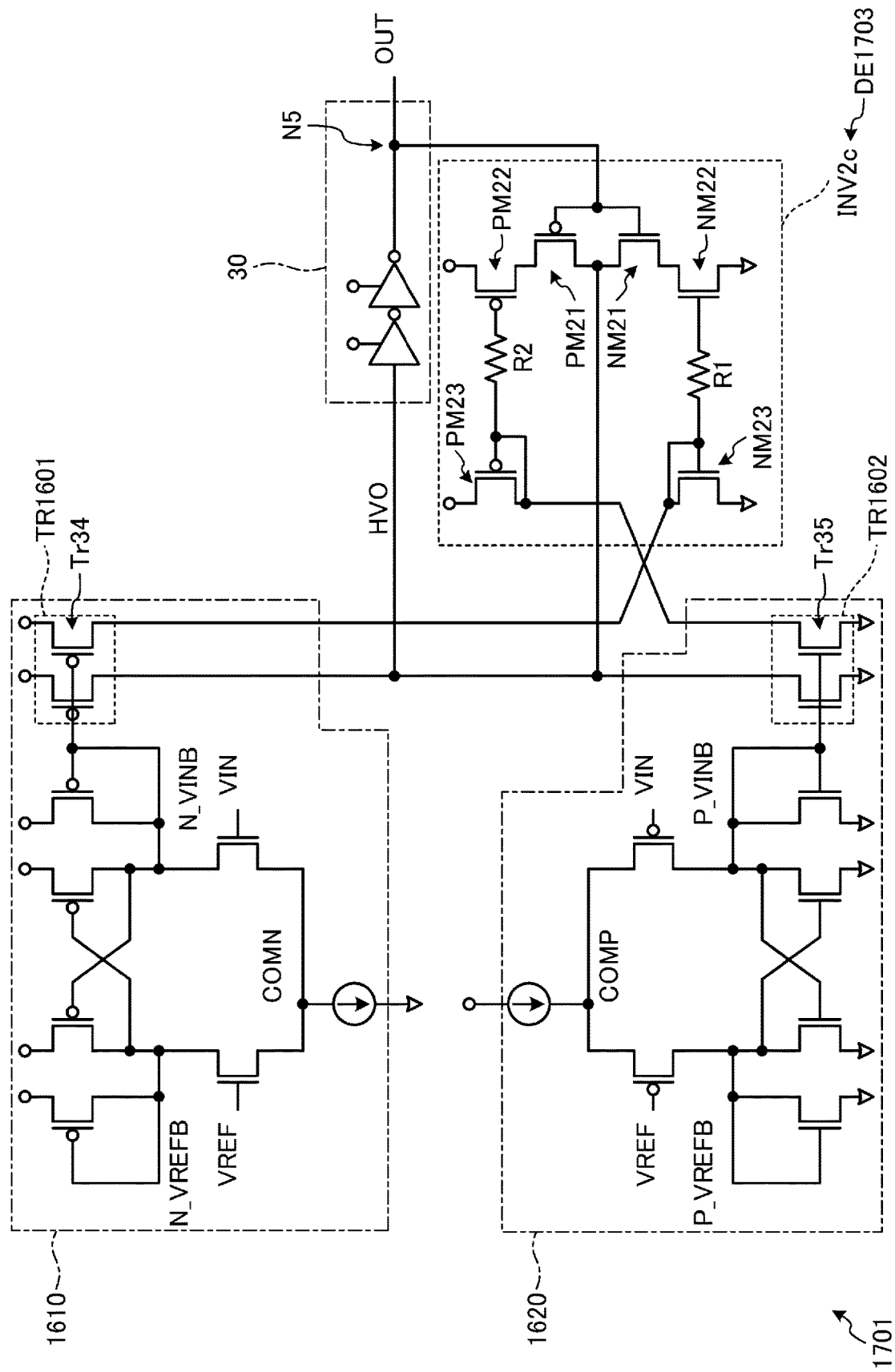
FIG. 22 is a circuit diagram showing a configuration of a semiconductor device according to an eighteenth embodiment.

Specifically, a semiconductor device 1701 may be configured as shown in FIG. 22. FIG. 22 is a diagram showing a configuration of the semiconductor device 1701. The semiconductor device 1701 has a de-emphasis circuit DE1703 instead of the de-emphasis circuit DE1603 (refer to FIG. 21).

The de-emphasis circuit DE1703 has an inverter INV2c instead of the inverter INV2b (refer to FIG. 21). The inverter INV2c further has a resistive element R1 and a resistive element R2.

One end of the resistive element R1 is connected to the gate of the transistor NM23, and the other end thereof is connected to the gate of the transistor NM22. The transistors PM22 and PM23 and the resistive element R1 configure a current mirror circuit. The current mirror circuit supplies a current to which a drain current of the transistor Tr34 is copied according to a mirror ratio, to the drain side of the transistor NM21 at a timing delayed by the resistive element R1.

Consequently, it is possible to slightly delay a timing until an H level amplitude is attenuated by the de-emphasis circuit DE1703 after the signal HVO transitions from the L level to the H level. Thus, it is possible to secure a long overshoot period when forming a waveform of the signal HVO into an overshoot waveform in the de-emphasis circuit DE1703, and thus to easily stabilize the H level amplitude before attenuation. This is effective for securing an amplitude, for example, when the H level amplitude of the signal HVO is small.

One end of the resistive element R2 is connected to the gate of the transistor PM23, and the other end thereof is connected to the gate of the transistor PM22. The transistors NM22 and NM23 and the resistive element R2 configure a current mirror circuit. The current mirror circuit supplies a current to which a drain current of the transistor Tr35 is copied according to a mirror ratio, to the drain side of the transistor PM21 at a timing delayed by the resistive element R2.

Consequently, it is possible to slightly delay a timing until an L level amplitude is attenuated by the de-emphasis circuit DE1703 after the signal HVO transitions from the H level to the L level. Therefore, it is possible to secure a long undershoot period when forming a waveform of the signal HVO into an undershoot waveform in the de-emphasis circuit DE1703, and thus to easily stabilize the L level amplitude before attenuation. This is effective for securing an amplitude, for example, when the L level amplitude of the signal HVO is small.

As described above, in the eighteenth embodiment, in the semiconductor device 1701, an operation point of the de-emphasis circuit DE1703 is slightly delayed with respect to the differential amplification circuits 1610 and 1620. Consequently, an amplitude of the signal HVO can be easily stabilized when the de-emphasis circuit DE1703 forms a waveform of the signal HVO into an overshoot waveform and an undershoot waveform.

Nineteenth Embodiment

Next, a semiconductor device to a nineteenth embodiment will be described. Hereinafter, a description will focus on differences from the first embodiment to the eighteenth embodiment.

In the eighteenth embodiment, a configuration of the de-emphasis circuit DE1703 for delaying the operation point is implemented by using an inverter, but, in the nineteenth embodiment, the configuration is implemented without using an inverter.

Figure 23:
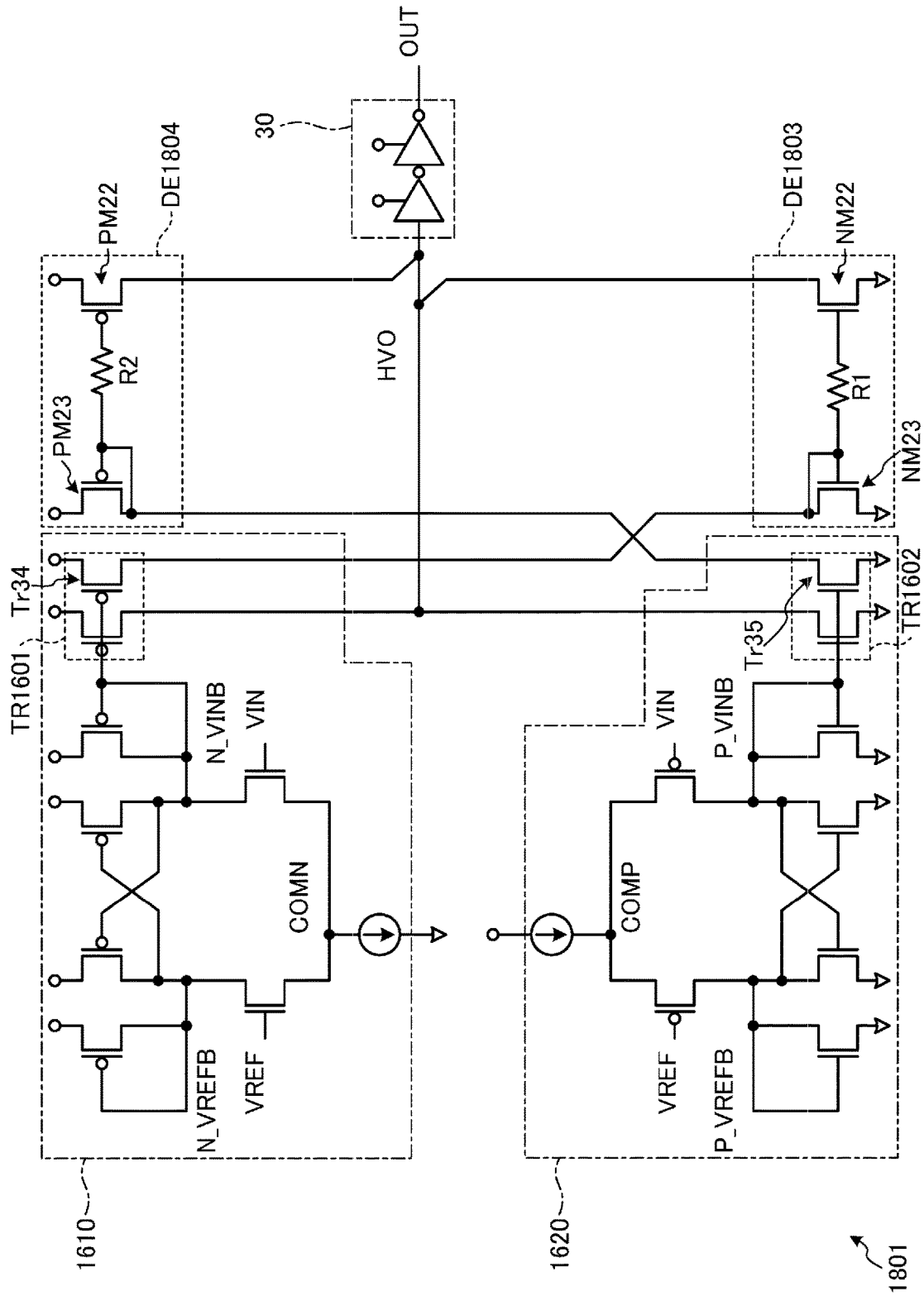
FIG. 23 is a circuit diagram showing a configuration of a semiconductor device according to a nineteenth embodiment.

Specifically, a semiconductor device 1801 may be configured as shown in FIG. 23. FIG. 23 is a diagram showing a configuration of the semiconductor device 1801. The semiconductor device 1801 has de-emphasis circuits DE1803 and DE1804 instead of the de-emphasis circuit DE1703 (refer to FIG. 22). The de-emphasis circuit DE1803 and DE1804 are configured by omitting the transistors NM21 and PM21 as inverters from the de-emphasis circuit DE1703 and separating the two current mirror circuits from each other. Consequently, delay amounts of operation points of the de-emphasis circuits DE1803 and DE1804 can be determined regardless of a delay time of the inverter configuration.

The de-emphasis circuit DE1803 includes transistors NM22 and NM23 and a resistive element R1. The transistors NM22 and NM23 and the resistive element R1 configure a current mirror circuit. The current mirror circuit supplies a current to which a drain current of the transistor Tr34 is copied according to a mirror ratio, to the input node of the output circuit 30 at a timing delayed by the resistive element R1. Consequently, it is possible to slightly delay a timing until an H level amplitude is attenuated by the de-emphasis circuit DE1803 after the signal HVO transitions from the L level to the H level. In this case, a delay amount of the operation point of the de-emphasis circuit DE1803 with respect to the differential amplification circuits 1610 and 1620 is adjusted by using a resistance value of the resistive element R1.

The de-emphasis circuit DE1804 includes transistors PM22 and PM23 and a resistive element R2. The transistors PM22 and PM23 and the resistive element R2 configure a current mirror circuit. The current mirror circuit supplies a current to which a drain current of the transistor Tr35 is copied according to a mirror ratio, to the input node of the output circuit 30 at a timing delayed by the resistive element R2. Consequently, it is possible to slightly delay a timing until an L level amplitude is attenuated by the de-emphasis circuit DE1804 after the signal HVO transitions from the H level to the L level. In this case, a delay amount of the operation point of the de-emphasis circuit DE1804 with respect to the differential amplification circuits 1610 and 1620 is adjusted by using a resistance value of the resistive element R2.

As described above, in the nineteenth embodiment, in the semiconductor device 1801, delay amounts of the operation points of the de-emphasis circuits DE1803 and DE1804 with respect to the differential amplification circuit 1610 and 1620 are adjusted by using resistance values of the resistive elements R1 and R2. Consequently, high accuracy of delay amounts of the operation points of the de-emphasis circuits DE1803 and DE1804 can be achieved.

Figure 24:
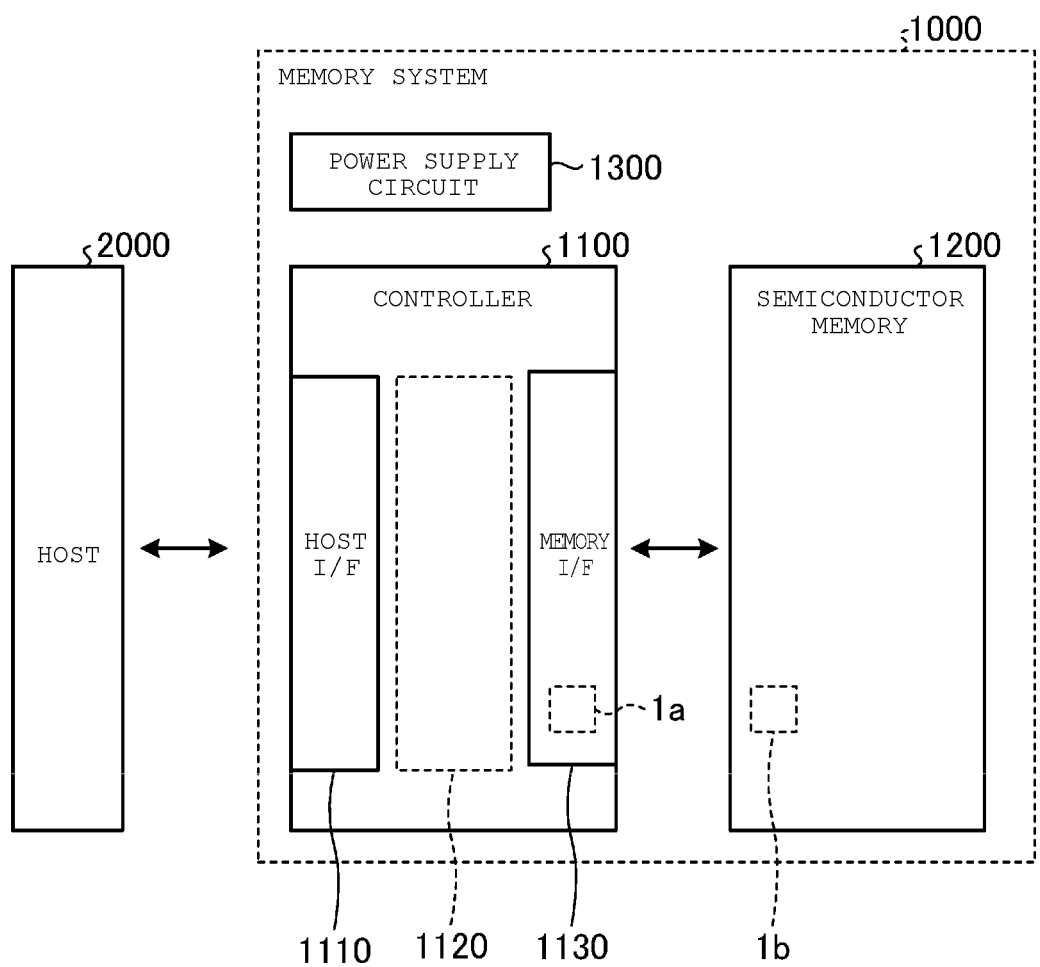
FIG. 24 is a circuit diagram showing a configuration of a memory system to which the semiconductor devices to the first to nineteenth embodiments are applicable.

Next, a memory system 1000 to which the semiconductor device according to the first to nineteenth embodiments is applied will be described with reference to FIG. 24. FIG. 24 is a diagram showing a configuration of the memory system 1000 to which the semiconductor device according to the first to nineteenth embodiments is applied.

The memory system 1000 is connectable to a host 2000 and may function as an external storage medium of the host 2000. The host 2000 is, for example, a personal computer, and the memory system 1000 is, for example, an SSD. The memory system 1000 includes a controller 1100, a semiconductor memory 1200, and a power supply circuit 1300. The controller 1100 is a circuit as hardware, and includes a host interface circuit (host I/F) 1110, a signal processing circuit 1120, and a memory interface circuit (memory I/F) 1130. The power supply circuit 1300 generates a plurality of types of power supply voltages (for example, power supply voltages VCCQ and VDDC) and supplies the voltages to each part of the memory system 1000.

For example, the semiconductor memory 1200 has a semiconductor device 1*b* as a receiver. The memory I/F 1130 receives predetermined signals from the signal processing circuit 1120 and transmits the signals to the semiconductor device 1*b*. The semiconductor device 1*b* operates by using the voltages (for example, power supply voltages VCCQ and VDDC) received from the power supply circuit 1300, and receives the signals transmitted from the memory I/F 1130. The semiconductor device 1*b* supplies the received signals to the semiconductor memory 1200.

The signals may be single-end signals such as write data, a reference voltage, a chip selection signal (CE), a command latch enable signal (CLE), an address latch enable signal (ALE), a write enable signal (WE), and a write protect signal (WP). In this case, the semiconductor device 1*b* is applicable to any semiconductor device according to the first to fifth embodiments, the eighth to eleventh embodiments, and the sixteenth to nineteenth embodiments.

Alternatively, the signals may be differential signals such as a data strobe signal (DQS/BDQS) at the time of writing and a read enable signal (RE/BRE). In this case, the semiconductor device 1b is applicable to any semiconductor device according to the sixth embodiment, the seventh embodiment, and the twelfth to fifteenth embodiments.

The memory I/F 1130 has a semiconductor device 1a as a receiver. The semiconductor memory 1200 transmits predetermined signals to the semiconductor device 1a. The semiconductor device 1a operates by using the voltages (for example, power supply voltages VCCQ and VDDC) received from the power supply circuit 1300, and receives the signals transmitted from the semiconductor memory 1200. The semiconductor device 1a supplies the received signals to the signal processing circuit 112.

The signals may be single-end signals such as read data and a ready/busy signal (R/B). In this case, the semiconductor device 1a is applicable to any semiconductor device according to the first to fifth embodiments, the eighth to eleventh embodiments, and the sixteenth to nineteenth embodiments.

Alternatively, the signals may be, a differential signal such as a data strobe signal (DQS/BDQS) at the time of reading. In this case, the semiconductor device 1a is applicable to any semiconductor device according to the sixth embodiment, the seventh embodiment, and the twelfth to fifteenth embodiments.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
    a first differential amplification circuit, including
        a first input transistor having a gate configured to receive a first signal,
        a second input transistor having a gate configured to receive a second signal,
        a first current source connected to a source of the first input transistor and a source of the second input transistor,
        a first transistor that is connected to the source of the first input transistor and the source of the second input transistor in parallel to the first current source and has a gate configured to receive the first signal,
        a second transistor that is connected in series to the first transistor and has a gate configured to receive a control signal,
        a third transistor connected in series to the first input transistor,
        a fourth transistor, the third and fourth transistors configured as a current mirror circuit, and
        a fifth transistor that is connected in series to the third transistor and has a gate configured to receive the control signal.

2. The semiconductor device according to claim 1, wherein
    the semiconductor device further comprises
        a first inverter disposed on an output line between a drain of the fourth transistor and an output node, and
        a second inverter that is disposed on a feedback line that extends from a node on the output line to the drain of the fourth transistor, the second inverter having a drive force smaller than a drive force of the first inverter.

3. The semiconductor device according to claim 1, wherein the first differential amplification circuit further includes
    a sixth transistor connected in series to the first input transistor,
    a fourth transistor, the fourth and sixth transistors configured as a current mirror circuit, and
    a seventh transistor that is connected in series to the sixth transistor and has a gate receiving the first signal.

4. The semiconductor device according to claim 3, wherein
    the first differential amplification circuit further includes
        an eighth transistor connected in parallel to a drain side of the first input transistor along with the sixth transistor,
        a ninth transistor diode-connected via the eighth transistor,
        a tenth transistor connected to a drain side of the second input transistor and to gate and drain sides of the eighth transistor, and
        an eleventh transistor diode-connected via the tenth transistor.

5. The semiconductor device according to claim 1, further comprising:
    a third inverter connected between a drain of the fourth transistor and the gate of the second transistor to generate the control signal.

6. The semiconductor device according to claim 5, wherein the first differential amplification circuit further includes
    a capacitive element that has one end connected to an output node of the third inverter and the other end connected to a gate of the fourth transistor.

7. The semiconductor device according to claim 1, further comprising:
    a second differential amplification circuit having a polarity inverted from a polarity of the first differential amplification circuit, wherein
    the second differential amplification circuit includes
        a third input transistor having a gate configured to receive the first signal,
        a fourth input transistor having a gate configured to receive the second signal,
        a second current source connected to a source of the third input transistor and a source of the fourth input transistor,
        a twelfth transistor that is connected in parallel to the source of the third input transistor and the source of the fourth input transistor along with the second current source, and has a gate configured to receive the first signal, and
        a thirteenth transistor that is connected in series to the twelfth transistor and has a gate configured to receive the control signal.

8. A semiconductor device comprising:
    a first differential amplification circuit, including
        a first input transistor having a gate configured to receive a first signal,
        a third transistor connected in series to the first input transistor,
        a fourth transistor, the third and fourth transistors configured as a current mirror circuit, a fifth transistor that is connected in series to the third transistor and has a gate configured to receive a control signal, a second input transistor having a gate configured to receive a second signal, a first current source connected to a source of the first input transistor and a source of the second input transistor, a first transistor that is connected to the source of the first input transistor and the source of the second input transistor along with the first current source, and has a gate configured to receive the first signal, and a second transistor that is connected in series to the first transistor and has a gate configured to receive the control signal;

a first inverter disposed on an output line between a drain of the fourth transistor and an output node; and a second inverter disposed on a feedback line that extends from a node on the output line to the drain of the fourth transistor, the second inverter having a drive force smaller than a drive force of the first inverter.

9. The semiconductor device according to claim 8, wherein the first differential amplification circuit further includes a sixth transistor connected in series to the first input transistor, the fourth and sixth transistors configured as a current mirror circuit, and a seventh transistor that is connected in series to the sixth transistor and has a gate configured to receive the first signal.

10. The semiconductor device according to claim 9, wherein the first differential amplification circuit further includes an eighth transistor connected in parallel to a drain side of the first input transistor along with the sixth transistor, a ninth transistor diode-connected via the eighth transistor, a second input transistor that has a gate configured to receive a second signal, a tenth transistor that is connected to a drain side of the second input transistor and to gate and drain sides of the eighth transistor, and an eleventh transistor diode-connected via the tenth transistor.

11. The semiconductor device according to claim 8, further comprising:

a third inverter connected between a drain of the fourth transistor and the gate of the fifth transistor to generate the control signal, wherein the first differential amplification circuit further includes a capacitive element that has one end connected to an output node of the third inverter and the other end connected to a gate of the fourth transistor.

12. The semiconductor device according to claim 8, further comprising:

a second differential amplification circuit having a polarity inverted from a polarity of the first differential amplification circuit, wherein the second differential amplification circuit includes a third input transistor having a gate configured to receive the first signal, a fourteenth transistor connected in series to the third input transistor, a fifteenth transistor, the fourteenth and fifteenth transistors configured as a current mirror circuit, and a sixteenth transistor that is connected in series to the fourteenth transistor and has a gate configured to receive the control signal.

13. A semiconductor device comprising:

a first differential amplification circuit that includes a first input transistor having a gate configured to receive a first signal, a sixth transistor connected in series to the first input transistor, a fourth transistor, the fourth and sixth transistors configured as a current mirror circuit, and a seventh transistor that is connected in series to the sixth transistor and has a gate configured to receive the first signal;

a first inverter disposed on an output line between a drain of the fourth transistor and an output node; and a second inverter disposed on a feedback line that extends from a node on the output line to the drain of the fourth transistor, the second inverter having a drive force smaller than a drive force of the first inverter.

14. The semiconductor device according to claim 13, wherein the first differential amplification circuit further includes an eighth transistor connected in parallel to a drain side of the first input transistor along with the sixth transistor, a ninth transistor diode-connected via the eighth transistor, a second input transistor that has a gate configured to receive a second signal, a tenth transistor connected to a drain side of the second input transistor and to gate and drain sides of the eighth transistor, and an eleventh transistor diode-connected via the tenth transistor.

15. The semiconductor device according to claim 13, further comprising:

a third inverter connected to the drain of the fourth transistor to generate the control signal, wherein the first differential amplification circuit further includes a capacitive element that has one end connected to an output node of the third inverter and the other end connected to a gate of the fourth transistor.

16. The semiconductor device according to claim 13, further comprising:

a second differential amplification circuit having a polarity inverted from a polarity of the first differential amplification circuit, wherein the second differential amplification circuit includes a third input transistor having a gate configured to receive the first signal, a seventeenth transistor connected in series to the third input transistor, and a fifteenth transistor, the fifteenth and seventeenth transistors configured as a current mirror, the output line extends between the drain of the fourth transistor and a drain of the fifteenth transistor, and the output node, and the feedback line extends from the node on the output line to the drain of the fourth transistor and the drain of the fifteenth transistor.

* * * * *